(12) United States Patent
Lee et al.

(10) Patent No.: US 8,569,870 B1
(45) Date of Patent: Oct. 29, 2013

(54) INTEGRATED CIRCUIT PACKAGING SYSTEM WITH SHIELDING SPACER AND METHOD OF MANUFACTURE THEREOF

(75) Inventors: SinJae Lee, Icheon-si (KR); JongVin Park, Seoul (KR); Sung Jun Yoon, Icheon-si (KR); JiHoon Oh, Suwon (KR)

(73) Assignee: Stats Chippac Ltd., Singapore (SG)

( * ) Notice: Subject to any disclaimer, the term of this patent is extended or adjusted under 35 U.S.C. 154(b) by 0 days.

(21) Appl. No.: 13/531,941

(22) Filed: Jun. 25, 2012

(51) Int. Cl.
*H01L 21/44* (2006.01)

(52) U.S. Cl.
USPC .................................. 257/660; 257/E23.001

(58) Field of Classification Search
USPC .......................................... 257/660, E23.001
See application file for complete search history.

(56) References Cited

U.S. PATENT DOCUMENTS

| | | |
|---|---|---|
| 5,977,626 A | 11/1999 | Wang et al. |
| 6,472,741 B1 | 10/2002 | Chen et al. |
| 6,627,990 B1 | 9/2003 | Shim et al. |
| 6,919,631 B1 | 7/2005 | Hoffman et al. |
| 6,946,729 B2 | 9/2005 | Lee et al. |
| 7,126,218 B1 | 10/2006 | Darveaux et al. |
| 7,205,651 B2 | 4/2007 | Do et al. |
| 8,039,316 B2 | 10/2011 | Chi et al. |
| 8,039,365 B2 | 10/2011 | Lee et al. |

*Primary Examiner* — Anthony Ho
(74) *Attorney, Agent, or Firm* — Ishimaru & Associates LLP; I-Chang John Yang

(57) ABSTRACT

A method of manufacture of an integrated circuit packaging system includes: providing a substrate; mounting a bottom integrated circuit over the substrate; connecting a bottom interconnect between the bottom integrated circuit and the substrate; and mounting a bottom shield-spacer above the bottom integrated circuit and the bottom shield-spacer includes a bottom shield plate above the bottom integrated circuit, a bottom shield pillar extending from a bottom shield foot and connected to the bottom shield plate, and a protuberance extending vertically above the bottom shield pillar and directly above the bottom shield foot.

10 Claims, 8 Drawing Sheets

INTEGRATED CIRCUIT PACKAGING SYSTEM WITH SHIELDING SPACER AND METHOD OF MANUFACTURE THEREOF

TECHNICAL FIELD

The present invention relates generally to an integrated circuit packaging system and more particularly to a system for utilizing a spacer in an integrated circuit packaging system.

BACKGROUND

The rapidly growing market for portable electronic devices, e.g. cellular phones, laptop computers, and personal digital assistants (PDAs), is an integral facet of modern life. The multitude of portable devices represents one of the largest potential market opportunities for next generation packaging. These devices have unique attributes that have significant impacts on manufacturing integration, in that they must be generally small, lightweight, and rich in functionality and they must be produced in high volumes at relatively low cost.

Packaging, materials engineering, and development are at the very core of these next generation electronics insertion strategies outlined in road maps for development of next generation products. Future electronic systems can be more intelligent, have higher density, use less power, operate at higher speed, and can include mixed technology devices and assembly structures at lower cost than today.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, electromagnetic interference, thermal loads, second level assembly reliability stresses and cost.

In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system, including: providing a substrate; mounting a bottom integrated circuit over the substrate; connecting a bottom interconnect between the bottom integrated circuit and the substrate; and mounting a bottom shield-spacer above the bottom integrated circuit and the bottom shield-spacer includes a bottom shield plate above the bottom integrated circuit, a bottom shield pillar extending from a bottom shield foot and connected to the bottom shield plate, and a protuberance extending vertically above the bottom shield pillar and directly above the bottom shield foot.

The present invention provides an integrated circuit packaging system, including: a substrate; a bottom integrated circuit over the substrate; a bottom interconnect connected between the bottom integrated circuit and the substrate; and a bottom shield-spacer above the bottom integrated circuit and the bottom shield-spacer includes a bottom shield plate above the bottom integrated circuit, a bottom shield pillar extends from a bottom shield foot and connects to the bottom shield plate, and a protuberance extends vertically above the bottom shield pillar and directly above the bottom shield foot.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
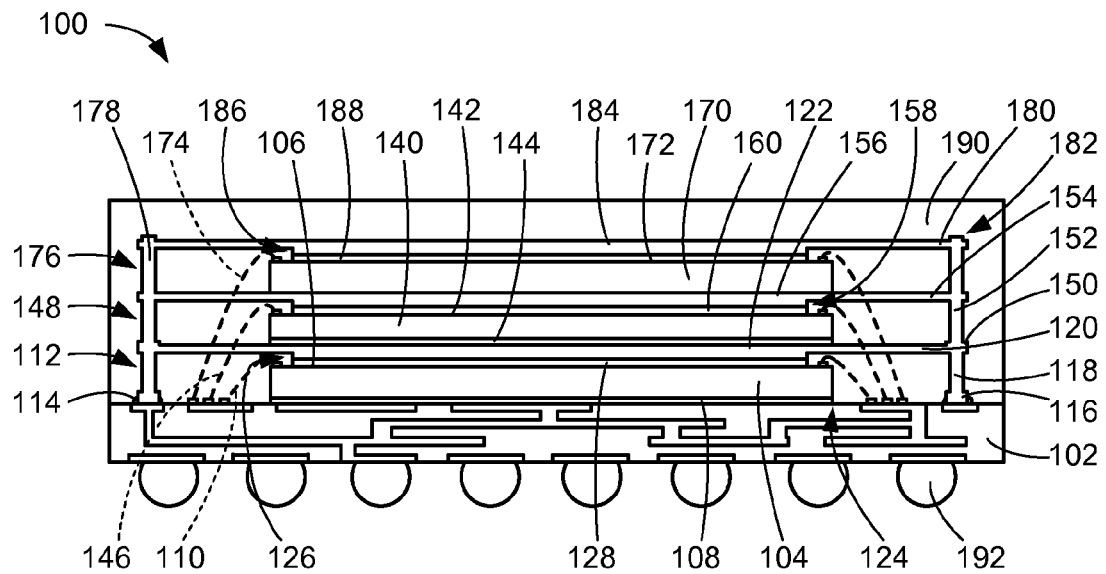
FIG. 1 is a cross-sectional view of an integrated circuit packaging system along the line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes can be made without departing from the scope of the present invention.

In the following description, numerous specific details are given to provide a thorough understanding of the invention. However, it will be apparent that the invention can be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active side of an integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure. The term "directly above" as used herein is defined as the same horizontal coordinates while having a greater vertical coordinate.

Figure 2:
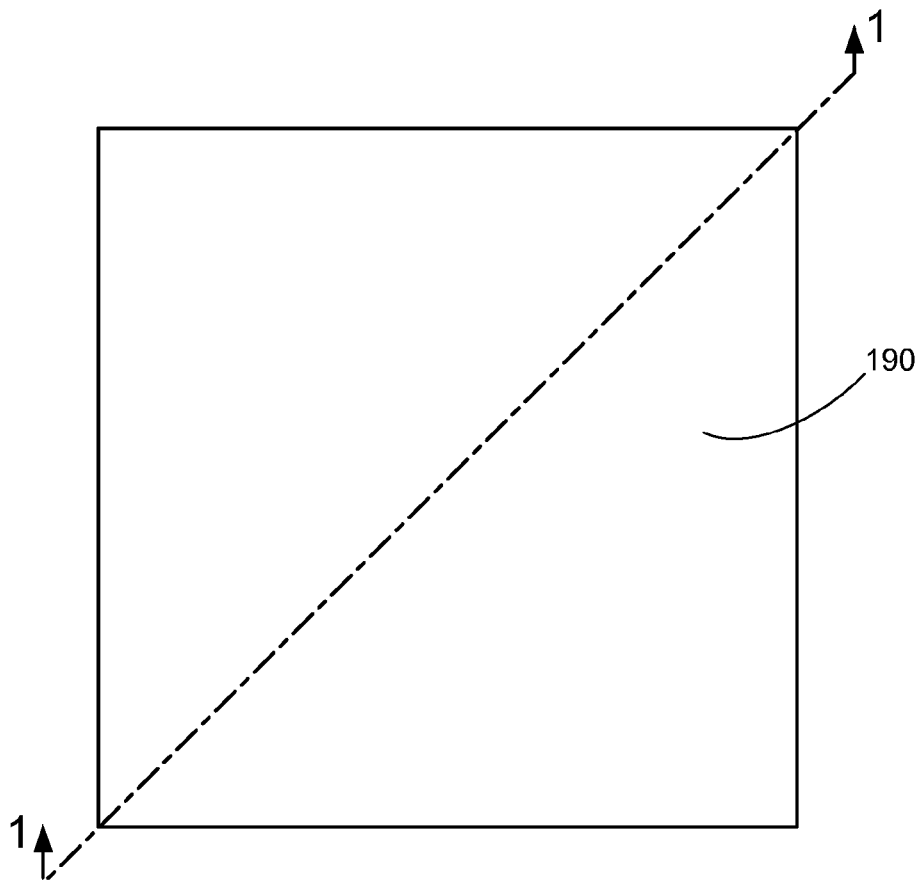
FIG. 2 is a top view of the integrated circuit packaging system of FIG. 1.

Referring now to FIG. 1, therein is shown a cross-sectional view of an integrated circuit packaging system 100 along the line 1-1 of FIG. 2 in a first embodiment of the present invention. The integrated circuit packaging system 100 is shown having a substrate 102. The substrate 102 is defined as a structure capable of electrical connection, signal routing with internal signal to signal isolation, and providing structural support for components to be mounted thereto. The substrate 102 can be a laminated plastic substrate or ceramic substrate.

A bottom integrated circuit 104 is mounted above and to the substrate 102. The bottom integrated circuit 104 can be mounted with a bottom die active side 106 of the bottom integrated circuit 104 facing away from the substrate 102. The bottom die active side 106 is defined as a surface having active circuitry fabricated thereon.

The bottom integrated circuit 104 can be attached to the substrate 102 with a bottom die attach adhesive 108. The bottom integrated circuit 104 can be connected to the substrate 102 with bottom interconnects 110. The bottom interconnects 110 can be in direct contact with the bottom die active side 106 of the bottom integrated circuit 104 and connected between the bottom die active side 106 and the substrate 102.

A bottom shield-spacer 112 can be attached to the substrate 102 peripheral to the bottom integrated circuit 104. The bottom shield-spacer 112 can extend from the substrate 102 above the bottom die active side 106 of the bottom integrated circuit 104. The bottom shield-spacer 112 can also extend from the substrate 102 above the bottom interconnects 110.

The bottom shield-spacer 112 can be attached to the substrate 102 with a conductive adhesive 114 in direct contact with the bottom shield-spacer 112 and the substrate 102. The conductive adhesive 114 can be a metal alloy, a mixture of metallic and non-metallic substances, or conductive polymer and can be both thermally and electrically conductive. The bottom shield-spacer 112 can be grounded through the substrate 102.

The bottom shield-spacer 112 can include bottom shield feet 116 extending laterally, parallel to the substrate 102. The bottom shield feet 116 can be flat bottomed or include a male protuberance, female protuberance, or a through hole, all described in greater detail below.

The bottom shield-spacer 112 can further include bottom shield pillars 118 extending vertically from the bottom shield feet 116. The bottom shield feet 116 can provide greater surface area for attachment between the bottom shield-spacer 112 and the substrate 102 than connecting the bottom shield pillars 118 directly to the substrate 102.

The bottom shield-spacer 112 can further include bottom shield tie bars 120. The bottom shield pillars 118 can extend from the bottom shield feet 116 to the bottom shield tie bars 120 or can extend above the bottom shield tie bars 120.

The bottom shield-spacer 112 can further include a bottom shield plate 122. The bottom shield plate 122 can be horizontally fixed over the bottom die active side 106 and connect between the bottom shield tie bars 120. The bottom shield tie bars 120 can extend horizontally from the bottom shield plate 122 and away from corner regions 124 of the bottom integrated circuit 104 and do not cover or extend directly above the bottom interconnects 110.

The bottom shield tie bars 120 can extend horizontally to the bottom shield pillars 118 and planar with the bottom shield pillars 118. The bottom shield tie bars 120 can also extend horizontally beyond the bottom shield pillars 118 and overhanging the bottom shield pillars 118.

The bottom shield plate 122 can cover most of the bottom die active side 106 but is not directly above the bottom interconnects 110 attached to the bottom die active side 106 and connecting the bottom integrated circuit 104 to the substrate 102. The bottom shield-spacer 112 can further include a bottom shield extension 126. The bottom shield extension 126 can extend below the bottom shield plate 122 toward the bottom die active side 106 of the bottom integrated circuit 104.

The bottom shield feet 116, the bottom shield pillars 118, the bottom shield tie bars 120, the bottom shield plate 122, and the bottom shield extension 126 can be fabricated integrally from the same material or can be a combination of conductive materials to form the bottom shield-spacer 112.

The bottom shield-spacer 112 can be an electrically conductive material such as a metal, a metal and non-metal combination, a metal alloy, or a conductive polymer.

The bottom shield extension 126 of the bottom shield-spacer 112 can be attached to the bottom die active side 106 of the bottom integrated circuit 104 with a bottom adhesive 128 therebetween. The bottom adhesive 128 can be electrically and thermally conductive or can be electrically isolative but thermally conductive depending on whether the bottom integrated circuit 104 is designed to interface electrically with the bottom shield-spacer 112. As an example of the bottom integrated circuit 104 interfacing electrically with the bottom shield-spacer 112, the bottom integrated circuit 104 can be grounded through the bottom shield-spacer 112.

A middle integrated circuit 140 is mounted above the substrate 102 and above the bottom integrated circuit 104. The middle integrated circuit 140 can be mounted with a middle die active side 142 of the middle integrated circuit 140 facing away from the substrate 102. The middle die active side 142 is defined as a surface having active circuitry fabricated thereon.

The middle integrated circuit 140 can be attached to the bottom shield-spacer 112 with a middle die attach adhesive 144. The middle integrated circuit 140 can be connected to the substrate 102 with middle interconnects 146. The middle interconnects 146 can be in direct contact with the middle die active side 142 of the middle integrated circuit 140 and connected between the middle integrated circuit 140 and the substrate 102.

A middle shield-spacer 148 can be attached to the bottom shield-spacer 112 peripheral to the middle integrated circuit 140. The middle shield-spacer 148 can extend from the bottom shield tie bars 120 and the bottom shield pillars 118 above the middle die active side 142 of the middle integrated circuit 140. The middle shield-spacer 148 can also extend from the bottom shield-spacer 112 above the middle interconnects 146.

The middle shield-spacer 148 can be attached to the bottom shield-spacer 112 with a conductive adhesive or can be attached to the bottom shield-spacer 112 with a male protuberance, a female protuberance or a combination of all three. The middle shield-spacer 148 can be grounded through electrical connection with the bottom shield-spacer 112 and the substrate 102.

The middle shield-spacer 148 can include middle shield feet 150 extending laterally, parallel to the substrate 102 and the bottom shield plate 122 of the bottom shield-spacer 112. The middle shield feet 150 can be flat bottomed or include a male protuberance, female protuberance, or a through hole, all described in greater detail below. The middle shield-spacer 148 can further include middle shield pillars 152 extending vertically from the middle shield feet 150. The middle shield feet 150 can provide greater surface area for attachment between the bottom shield-spacer 112 and the middle shield-spacer 148 than connecting the middle shield pillars 152 directly to the bottom shield tie bars 120 or the bottom shield pillars 118.

The middle shield-spacer 148 can further include middle shield tie bars 154. The middle shield pillars 152 can extend from the middle shield feet 150 to the middle shield tie bars 154 or can extend above the middle shield tie bars 154.

The middle shield-spacer 148 can further include a middle shield plate 156. The middle shield plate 156 can be horizontally fixed over the middle die active side 142 and extend between the middle shield tie bars 154. The middle shield tie bars 154 can extend from the middle shield plate 156 diagonally away from the middle integrated circuit 140 and do not cover or extend directly above the bottom interconnects 110 or the middle interconnects 146.

The middle shield tie bars 154 can extend horizontally to the middle shield pillars 152 and planar with the middle shield pillars 152. The middle shield tie bars 154 can also extend horizontally beyond the middle shield pillars 152 and overhanging the middle shield pillars 152.

The middle shield plate 156 can cover most of the middle die active side 142 but is not directly above the middle interconnects 146 attached to the middle die active side 142 and connecting the middle integrated circuit 140 to the substrate 102. The middle shield-spacer 148 can further include a middle shield extension 158. The middle shield extension 158 can extend below the middle shield plate 156 toward the middle die active side 142 of the middle integrated circuit 140.

The middle shield feet 150, the middle shield pillars 152, the middle shield tie bars 154, the middle shield plate 156, and the middle shield extension 158 can be fabricated integrally from the same material or can be a combination of conductive materials to form the middle shield-spacer 148. The middle shield-spacer 148 can be an electrically conductive material such as a metal, a metal and non-metal combination, a metal alloy, or a conductive polymer.

The middle shield-spacer 148 can be attached to the middle die active side 142 of the middle integrated circuit 140 with a middle adhesive 160. The middle adhesive 160 can be electrically and thermally conductive or can be electrically isolative but thermally conductive depending on whether the middle integrated circuit 140 is designed to interface electrically with the middle shield-spacer 148. As an example of the middle integrated circuit 140 interfacing electrically with the middle shield-spacer 148, the middle integrated circuit 140 can be grounded through the middle shield-spacer 148.

A top integrated circuit 170 is mounted above the middle integrated circuit 140, the middle shield-spacer 148, the bottom integrated circuit 104, the bottom shield-spacer 112, and the substrate 102. The top integrated circuit 170 can be mounted with a top die active side 172 of the top integrated circuit 170 facing away from the substrate 102. The top die active side 172 is defined as a surface having active circuitry fabricated thereon.

The top integrated circuit 170 can be mounted above the middle shield-spacer 148. The top integrated circuit 170 can be in direct contact with the middle shield-spacer 148. The top integrated circuit 170 can be connected to the substrate 102 with top interconnects 174. The top interconnects 174 can be in direct contact with the top die active side 172 of the top integrated circuit 170 and connected between the top integrated circuit 170 and the substrate 102. The bottom interconnects 110, the middle interconnects 146, and the top interconnects 174 are depicted as dotted or dashed lines to indicate the presence of the bottom interconnects 110, the middle interconnects 146 and the top interconnects 174 while simultaneously indicating that they would not be directly seen in the cross-sectional view along the line 1-1 of FIG. 2.

A top shield-spacer 176 can be attached to the middle shield-spacer 148 peripheral to the top integrated circuit 170. The top shield-spacer 176 can extend from the middle shield tie bars 154 and the middle shield pillars 152 of the middle shield-spacer 148 above the top die active side 172 of the top integrated circuit 170. The top shield-spacer 176 can also extend from the middle shield-spacer 148 above the top interconnects 174.

The top shield-spacer 176 can be attached to the middle shield-spacer 148 with a conductive adhesive or can be attached to the bottom shield-spacer 112 with a male protuberance, a female protuberance or a combination of all three. The top die active side 172 can be grounded through electrical connection with the middle shield-spacer 148, the bottom shield-spacer 112, and the substrate 102.

It has been discovered that utilizing the top shield-spacer 176, the bottom shield-spacer 112, or the middle shield-spacer 148 in combination with the bottom integrated circuit 104, the middle integrated circuit 140, or the top integrated circuit 170 reduces package height, serves to efficiently release heat from the package, and allows for improved wire bonding capability since the bottom shield tie bars 120 or the middle shield tie bars 154 do not encumber the bottom interconnects 110 or the middle interconnects 146.

It has further been discovered that utilizing the top shield-spacer 176, the bottom shield-spacer 112, or the middle shield-spacer 148 reduces noise, cross talk, and other effects between the bottom integrated circuit 104, the middle integrated circuit 140, and the top integrated circuit 170 while simultaneously providing a more efficient grounding plane.

The top shield-spacer 176 can include top shield pillars 178 extending vertically from the middle shield pillars 152 or the middle shield tie bars 154. The top shield-spacer 176 can further include top shield tie bars 180. The top shield pillars 178 can extend from the middle shield tie bars 154 or the middle shield pillars 152 to the top shield tie bars 180 or can extend above the top shield tie bars 180.

The top shield-spacer 176 can further include a top shield protuberance 182. The top shield protuberance 182 can include a male protuberance, a female protuberance or a combination of both.

The top shield-spacer 176 can further include a top shield plate 184. The top shield plate 184 can be horizontally fixed over the top integrated circuit 170 and extend between the top shield tie bars 180. The top shield tie bars 180 can extend from the top shield plate 184 diagonally away from the top integrated circuit 170 and do not cover or extend directly above the bottom interconnects 110, the middle interconnects 146, or the top interconnects 174.

The top shield tie bars 180 can extend horizontally to the top shield pillars 178 and planar with the top shield pillars 178. The top shield tie bars 180 can also extend horizontally beyond the top shield pillars 178 and overhanging the top shield pillars 178.

The top shield plate 184 can cover most of the top die active side 172 but is not directly above the top interconnects 174 attached to the top die active side 172 and connecting the top integrated circuit 170 to the substrate 102. The top shield-spacer 176 can further include a top shield extension 186. The top shield extension 186 can extend below the top shield pillars 178 toward the top die active side 172 of the top integrated circuit 170.

The top shield pillars 178, the top shield tie bars 180, the top shield plate 184, and the top shield extension 186 can be fabricated integrally from the same material or can be a combination of conductive materials to form the top shield-spacer 176. The top shield-spacer 176 can be an electrically conductive material such as a metal, a metal and non-metal combination, a metal alloy, or a conductive polymer.

The top shield-spacer 176 can be attached to the top die active side 172 of the top integrated circuit 170 with a top adhesive 188. The top adhesive 188 can be electrically and thermally conductive or can be electrically isolative but thermally conductive depending on whether the top integrated circuit 170 is designed to interface electrically with the top shield-spacer 176. As an example of the top integrated circuit 170 interfacing electrically with the top shield-spacer 176, the top integrated circuit 170 can be grounded through the top shield-spacer 176.

An encapsulation 190 can be formed around the bottom shield-spacer 112, the middle shield-spacer 148, and the top shield-spacer 176. The encapsulation 190 is defined as a structure that protects sensitive components from moisture, dust and other contamination. The encapsulation 190 can be glob top, film assist molding, or other encasement structure.

The encapsulation 190 further encases the bottom interconnects 110, the middle interconnects 146, the top interconnects 174, the bottom integrated circuit 104, the middle integrated circuit 140, and the top integrated circuit 170. The encapsulation 190 can be formed over the substrate 102. External interconnects 192 can be formed below the substrate 102 for further interconnection.

Referring now to FIG. 2, therein is shown a top view of the integrated circuit packaging system 100 of FIG. 1. The integrated circuit packaging system 100 is shown having the encapsulation 190 fully covering the top integrated circuit 170 of FIG. 1, the middle integrated circuit 140 of FIG. 1, and the bottom integrated circuit 104 of FIG. 1 and above the substrate 102 of FIG. 1.

Figure 3:
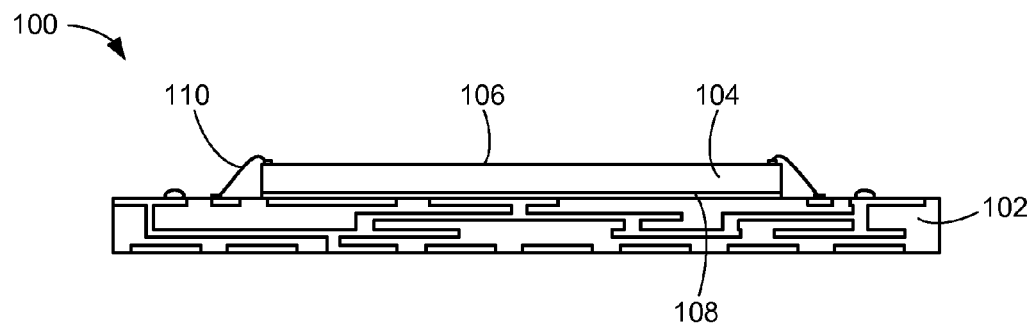
FIG. 3 is a cross-sectional view of the integrated circuit packaging system of FIG. 1 after a wire-bonding phase of manufacture.

Referring now to FIG. 3, therein is shown a cross-sectional view of the integrated circuit packaging system 100 of FIG. 1 after a wire-bonding phase of manufacture. The integrated circuit packaging system 100 is shown having the substrate 102.

The substrate 102 can have the bottom integrated circuit 104 mounted thereover and attached thereto with the bottom die attach adhesive 108. The bottom die active side 106 of the bottom integrated circuit 104 has been connected electrically to the substrate 102 by the bottom interconnects 110.

Figure 4:
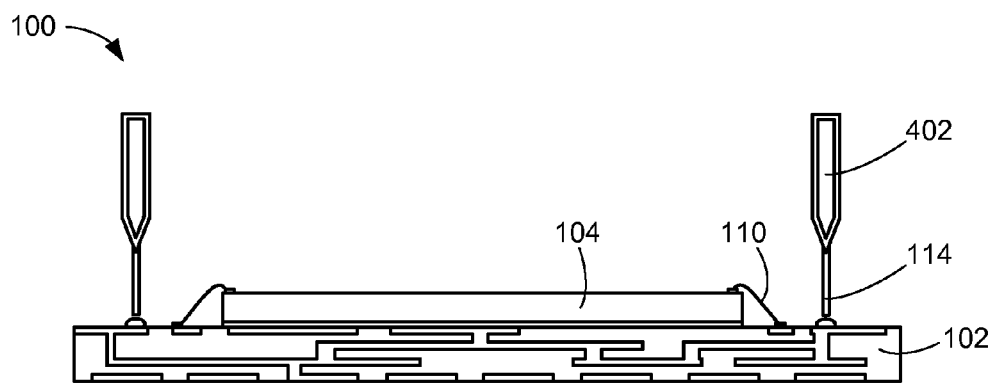
FIG. 4 is a cross-sectional view of the integrated circuit packaging system of FIG. 3 after a conductive adhesive deposition phase of manufacture.

Referring now to FIG. 4, therein is shown a cross-sectional view of the integrated circuit packaging system 100 of FIG. 3 after a conductive adhesive deposition phase of manufacture. The integrated circuit packaging system 100 is shown having the conductive adhesive 114 deposited directly on the substrate 102 with mechanized applicators 402. The conductive adhesive 114 can be deposited peripheral to the bottom interconnects 110 and the bottom integrated circuit 104.

Figure 5:
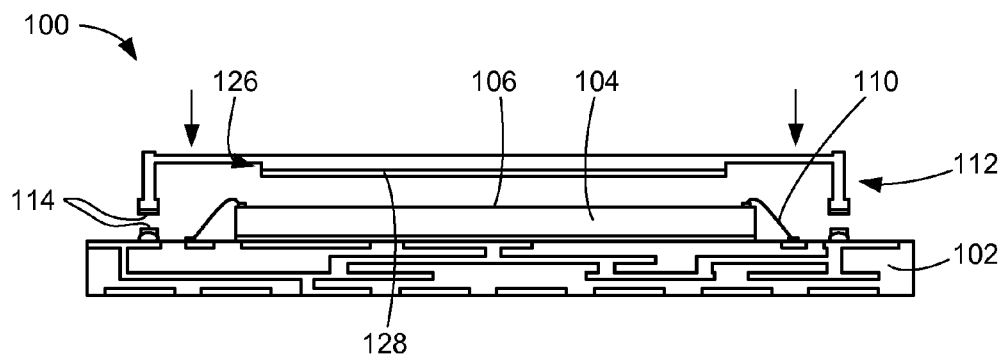
FIG. 5 is a cross-sectional view of the integrated circuit packaging system of FIG. 4 during a bottom shield-spacer placement phase of manufacture.

Referring now to FIG. 5, therein is shown a cross-sectional view of the integrated circuit packaging system 100 of FIG. 4 during a bottom shield-spacer placement phase of manufacture. The integrated circuit packaging system 100 is shown having the bottom shield-spacer 112 being mounted over the bottom integrated circuit 104 and on the substrate 102. The bottom shield-spacer 112 and the substrate 102 are shown having the conductive adhesive 114 formed thereon.

The bottom shield-spacer 112 is shown having the bottom adhesive 128 coated on the bottom shield extension 126. The bottom shield extension 126 with the bottom adhesive 128 can be aligned with the bottom die active side 106 of the bottom integrated circuit 104 and not directly above the bottom interconnects 110.

Figure 6:
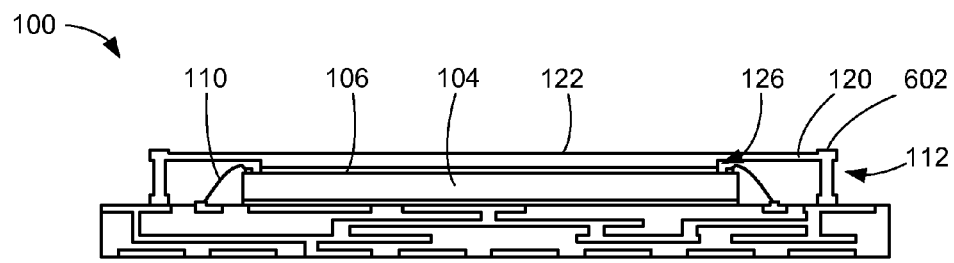
FIG. 6 is a cross-sectional view of the integrated circuit packaging system of FIG. 5 after a bottom shield-spacer placement phase of manufacture and along the line 6-6 of FIG. 7.
Figure 7:
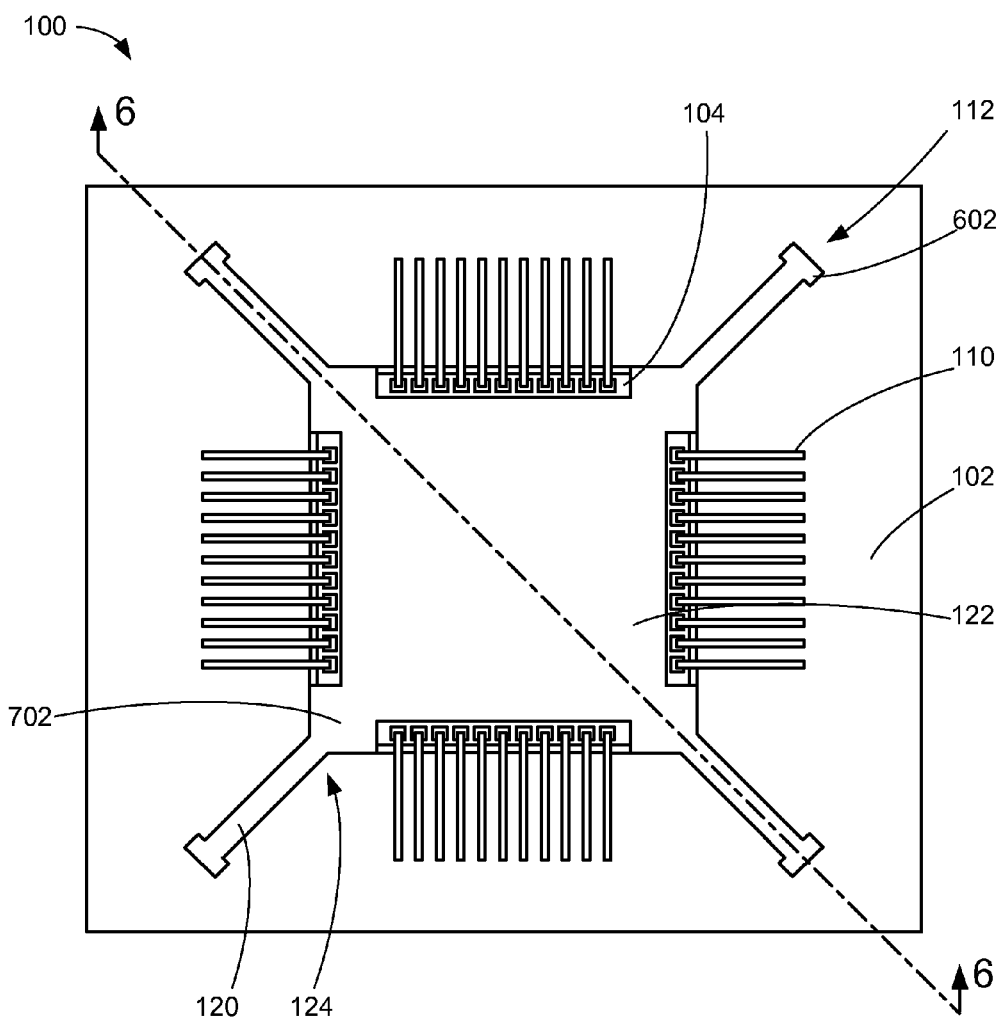
FIG. 7 is a top view of the integrated circuit packaging system of FIG. 6.

Referring now to FIG. 6, therein is shown a cross-sectional view of the integrated circuit packaging system 100 of FIG. 5 after a bottom shield-spacer placement phase of manufacture and along the line 6-6 of FIG. 7. The integrated circuit packaging system 100 is shown having the bottom shield plate 122 and the bottom shield extension 126 of the bottom shield-spacer 112 over the bottom die active side 106 of the bottom integrated circuit 104 but not directly over the bottom interconnects 110.

The bottom shield-spacer 112 can further include a bottom shield protuberance 602 extending above the bottom shield tie bars 120. The bottom shield protuberance 602 can provide increased surface area and mechanical control for further connections as shown in FIG. 1.

Referring now to FIG. 7, therein is shown a top view of the integrated circuit packaging system 100 of FIG. 6. The integrated circuit packaging system 100 is shown having the bottom integrated circuit 104 connected to the substrate 102 with the bottom interconnects 110.

The bottom shield plate 122 of the bottom shield-spacer 112 is shown covering the bottom integrated circuit 104 between the bottom interconnects 110 while not covering the bottom integrated circuit 104 near the bottom interconnects 110. The bottom shield-spacer 112 is further shown having the bottom shield tie bars 120 extending from the bottom shield plate 122 diagonally away from the corner regions 124 of the bottom integrated circuit 104.

The bottom shield-spacer 112 is further shown with bottom shield plate 122 having corner covers 702. The corner covers 702 can be between the bottom shield plate 122 and the bottom shield tie bars 120. The corner covers 702 are directly above the corner regions 124 of the bottom integrated circuit 104 but are not directly above the bottom interconnects 110 connected to the bottom integrated circuit 104. Near the other end of the bottom shield tie bars 120, the bottom shield protuberance 602 extends laterally widening the bottom shield tie bars 120 to provide increased surface area and structural rigidity for further connections as shown in FIG. 1.

It has been discovered that the corner covers 702 cover the corner regions 124 of the bottom integrated circuit 104 to further insulate the bottom integrated circuit 104 from crosstalk or noise and simultaneously reduce stress caused in the bottom shield plate 122 and improve mechanical support for mounting the middle integrated circuit 140 of FIG. 1 above the bottom shield-spacer 112.

Figure 8:
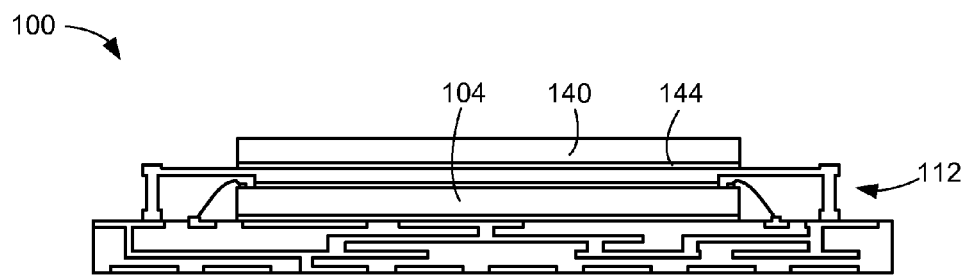
FIG. 8 is a cross-sectional view of the integrated circuit packaging system of FIG. 6 after a middle integrated circuit placement phase of manufacture.

Referring now to FIG. 8, therein is shown a cross-sectional view of the integrated circuit packaging system 100 of FIG. 6 after a middle integrated circuit placement phase of manufacture. The integrated circuit packaging system 100 is shown having the middle integrated circuit 140 mounted above the bottom shield-spacer 112 and the bottom integrated circuit 104. The middle integrated circuit 140 is further shown attached to the bottom shield-spacer 112 with the middle die attach adhesive 144.

Figure 9:
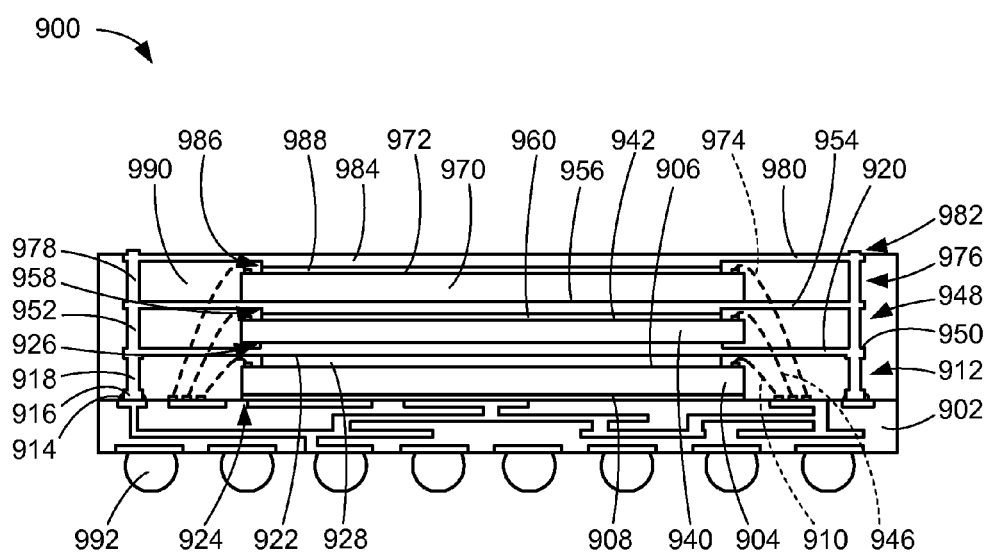
FIG. 9 is a cross-sectional view of an integrated circuit packaging system in a second embodiment of the present invention.

Referring now to FIG. 9, therein is shown a cross-sectional view of an integrated circuit packaging system 900 in a second embodiment of the present invention. The integrated circuit packaging system 900 is shown having a substrate 902. The substrate 902 is defined as a structure capable of electrical connection, signal routing with internal signal to signal isolation, and providing structural support for components to be mounted thereto. The substrate 902 can be a laminated plastic substrate or ceramic substrate.

A bottom integrated circuit 904 is mounted above and to the substrate 902. The bottom integrated circuit 904 can be mounted with a bottom die active side 906 of the bottom integrated circuit 904 facing away from the substrate 902. The bottom die active side 906 is defined as a surface having active circuitry fabricated thereon.

The bottom integrated circuit 904 can be attached to the substrate 902 with a bottom die attach adhesive 908. The bottom integrated circuit 904 can be connected to the substrate 902 with bottom interconnects 910. The bottom interconnects 910 can be in direct contact with the bottom die active side 906 of the bottom integrated circuit 904 and connected between the bottom die active side 906 and the substrate 902.

A bottom shield-spacer 912 can be attached to the substrate 902 peripheral to the bottom integrated circuit 904. The bottom shield-spacer 912 can extend from the substrate 902 above the bottom die active side 906 of the bottom integrated circuit 904. The bottom shield-spacer 912 can also extend from the substrate 902 above the bottom interconnects 910.

The bottom shield-spacer 912 can be attached to the substrate 902 with a conductive adhesive 914 in direct contact with the bottom shield-spacer 912 and the substrate 902. The conductive adhesive 914 can be a metal alloy, a mixture of metallic and non-metallic substances, or conductive polymer and can be both thermally and electrically conductive. The bottom shield-spacer 912 can be grounded through the substrate 902.

The bottom shield-spacer 912 can include bottom shield feet 916 extending laterally, parallel to the substrate 902. The bottom shield feet 916 can be flat bottomed or include a male protuberance, female protuberance, or a through hole, all described in greater detail below. The bottom shield-spacer 912 can further include bottom shield pillars 918 extending vertically from the bottom shield feet 916. The bottom shield feet 916 can provide greater surface area for attachment between the bottom shield-spacer 912 and the substrate 902 than connecting the bottom shield pillars 918 directly to the substrate 902.

The bottom shield-spacer 912 can further include bottom shield tie bars 920. The bottom shield pillars 918 can extend from the bottom shield feet 916 to the bottom shield tie bars 920 or can extend above the bottom shield tie bars 920.

The bottom shield-spacer 912 can further include a bottom shield plate 922. The bottom shield plate 922 can be horizontally fixed over the bottom die active side 906 and connect between the bottom shield tie bars 920. The bottom shield tie bars 920 can extend horizontally from the bottom shield plate 922 and away from corner regions 924 of the bottom integrated circuit 904 and do not cover or extend directly above the bottom interconnects 910.

The bottom shield tie bars 920 can extend horizontally to the bottom shield pillars 918 and planar with the bottom shield pillars 918. The bottom shield tie bars 920 can also extend horizontally beyond the bottom shield pillars 918 and overhanging the bottom shield pillars 918.

The bottom shield plate 922 can cover most of the bottom die active side 906 but is not directly above the bottom interconnects 910 attached to the bottom die active side 906 and connecting the bottom integrated circuit 904 to the substrate 902. The bottom shield-spacer 912 can further include a bottom shield extension 926. The bottom shield extension 926 can extend above the bottom shield plate 922 away from the bottom die active side 906 of the bottom integrated circuit 904.

The bottom shield feet 916, the bottom shield pillars 918, the bottom shield tie bars 920, the bottom shield plate 922, and the bottom shield extension 926 can be fabricated integrally from the same material or can be a combination of conductive materials to form the bottom shield-spacer 912. The bottom shield-spacer 912 can be an electrically conductive material such as a metal, a metal and non-metal combination, a metal alloy, or a conductive polymer.

The bottom shield plate 922 of the bottom shield-spacer 912 can be attached to the bottom die active side 906 of the bottom integrated circuit 904 with a bottom adhesive 928 therebetween. The bottom adhesive 928 can be electrically and thermally conductive or can be electrically isolative but thermally conductive depending on whether the bottom integrated circuit 904 is designed to interface electrically with the bottom shield-spacer 912. As an example of the bottom integrated circuit 904 interfacing electrically with the bottom shield-spacer 912, the bottom integrated circuit 904 can be grounded through the bottom shield-spacer 912.

A middle integrated circuit 940 is mounted above the substrate 902 and above the bottom integrated circuit 904. The middle integrated circuit 940 can be mounted with a middle die active side 942 of the middle integrated circuit 940 facing away from the substrate 902. The middle die active side 942 is defined as a surface having active circuitry fabricated thereon.

The middle integrated circuit 940 can be directly attached to the bottom shield extension 926 of the bottom shield-spacer 912. The middle integrated circuit 940 can be connected to the substrate 902 with middle interconnects 946. The middle interconnects 946 can be in direct contact with the middle die active side 942 of the middle integrated circuit 940 and connected between the middle integrated circuit 940 and the substrate 902.

A middle shield-spacer 948 can be attached to the bottom shield-spacer 912 peripheral to the middle integrated circuit 940. The middle shield-spacer 948 can extend from the bottom shield tie bars 920 and the bottom shield pillars 918 above the middle die active side 942 of the middle integrated circuit 940. The middle shield-spacer 948 can also extend from the bottom shield-spacer 912 above the middle interconnects 946.

The middle shield-spacer 948 can be attached to the bottom shield-spacer 912 with a conductive adhesive or can be attached to the bottom shield-spacer 912 with a male protuberance, a female protuberance or a combination of all three. The middle shield-spacer 948 can be grounded through electrical connection with the bottom shield-spacer 912 and the substrate 902.

The middle shield-spacer 948 can include middle shield feet 950 extending laterally, parallel to the substrate 902 and the bottom shield plate 922 of the bottom shield-spacer 912. The middle shield feet 950 can be flat bottomed or include a male protuberance, female protuberance, or a through hole, all described in greater detail below. The middle shield-spacer 948 can further include middle shield pillars 952 extending vertically from the middle shield feet 950. The middle shield feet 950 can provide greater surface area for attachment between the bottom shield-spacer 912 and the middle shield-spacer 948 than connecting the middle shield pillars 952 directly to bottom shield tie bars 920 or the bottom shield pillars 918.

The middle shield-spacer 948 can further include middle shield tie bars 954. The middle shield pillars 952 can extend from the middle shield feet 950 to the middle shield tie bars 954 or can extend above the middle shield tie bars 954.

The middle shield-spacer 948 can further include a middle shield plate 956. The middle shield plate 956 can be horizontally fixed over the middle die active side 942 and extend between the middle shield tie bars 954. The middle shield tie bars 954 can extend from the middle shield plate 956 diagonally away from the middle integrated circuit 940 and do not cover or extend directly above the bottom interconnects 910 or the middle interconnects 946.

The middle shield tie bars 954 can extend horizontally to the middle shield pillars 952 and planar with the middle shield pillars 952. The middle shield tie bars 954 can also extend horizontally beyond the middle shield pillars 952 and overhanging the middle shield pillars 952.

The middle shield plate 956 can cover most of the middle die active side 942 but is not directly above the middle interconnects 946 attached to the middle die active side 942 and connecting the middle integrated circuit 940 to the substrate 902. The middle shield-spacer 948 can further include a middle shield extension 958. The middle shield extension 958 can extend below the middle shield plate 956 toward the middle die active side 942 of the middle integrated circuit 940.

The middle shield feet 950, the middle shield pillars 952, the middle shield tie bars 954, the middle shield plate 956, and the middle shield extension 958 can be fabricated integrally from the same material or can be a combination of conductive materials to form the middle shield-spacer 948. The middle shield-spacer 948 can be an electrically conductive material such as a metal, a metal and non-metal combination, a metal alloy, or a conductive polymer.

The middle shield-spacer 948 can be attached to the middle die active side 942 of the middle integrated circuit 940 with a middle adhesive 960. The middle adhesive 960 can be electrically and thermally conductive or can be electrically isolative but thermally conductive depending on whether the middle integrated circuit 940 is designed to interface electrically with the middle shield-spacer 948. As an example of the middle integrated circuit 940 interfacing electrically with the middle shield-spacer 948, the middle integrated circuit 940 can be grounded through the middle shield-spacer 948.

A top integrated circuit 970 is mounted above the middle integrated circuit 940, the middle shield-spacer 948, the bottom integrated circuit 904, the bottom shield-spacer 912, and the substrate 902. The top integrated circuit 970 can be mounted with a top die active side 972 of the top integrated circuit 970 facing away from the substrate 902. The top die active side 972 is defined as a surface having active circuitry fabricated thereon.

The top integrated circuit 970 can be mounted above the middle shield-spacer 948. The top integrated circuit 970 can be in direct contact with the middle shield-spacer 948. The top integrated circuit 970 can be connected to the substrate 902 with top interconnects 974. The top interconnects 974 can be in direct contact with the top die active side 972 of the top integrated circuit 970 and connected between the top integrated circuit 970 and the substrate 902.

A top shield-spacer 976 can be attached to the middle shield-spacer 948 peripheral to the top integrated circuit 970. The top shield-spacer 976 can extend from the middle shield tie bars 954 and the middle shield pillars 952 of the middle shield-spacer 948 above the top die active side 972 of the top integrated circuit 970. The top shield-spacer 976 can also extend from the middle shield-spacer 948 above the top interconnects 974.

The top shield-spacer 976 can be attached to the middle shield-spacer 948 with a conductive adhesive or can be attached to the bottom shield-spacer 912 with a male protuberance, a female protuberance or a combination of all three. The top die active side 972 can be grounded through electrical connection with the middle shield-spacer 948, the bottom shield-spacer 912, and the substrate 902.

It has been discovered that utilizing the top shield-spacer 976, the bottom shield-spacer 912, or the middle shield-spacer 948 in combination with the bottom integrated circuit 904, the middle integrated circuit 940, or the top integrated circuit 970 reduces package height, serves to efficiently release heat from the package, and allows for improved wire bonding capability since the bottom shield tie bars 920 or the middle shield tie bars 954 do not encumber the bottom interconnects 910 or the middle interconnects 946.

It has further been discovered that utilizing the top shield-spacer 976, the bottom shield-spacer 912, or the middle shield-spacer 948 reduces noise, cross talk, and other effects between the bottom integrated circuit 904, the middle integrated circuit 940, and the top integrated circuit 970 while simultaneously providing a more efficient grounding plane.

The top shield-spacer 976 can include top shield pillars 978 extending vertically from the middle shield pillars 952 or the middle shield tie bars 954. The top shield-spacer 976 can further include top shield tie bars 980. The top shield pillars 978 can extend from the middle shield tie bars 954 or the middle shield pillars 952 to the top shield tie bars 980 or can extend above the top shield tie bars 980.

The top shield-spacer 976 can further include a top shield protuberance 982. The top shield protuberance 982 can include a male protuberance, a female protuberance or a combination of both.

The top shield-spacer 976 can further include a top shield plate 984. The top shield plate 984 can be horizontally fixed over the top integrated circuit 970 and extend between the top shield tie bars 980. The top shield tie bars 980 can extend from the top shield plate 984 diagonally away from the top integrated circuit 970 and do not cover or extend directly above the bottom interconnects 910, the middle interconnects 946, or the top interconnects 974.

The top shield tie bars 980 can extend horizontally to the top shield pillars 978 and planar with the top shield pillars 978. The top shield tie bars 980 can also extend horizontally beyond the top shield pillars 978 and overhanging the top shield pillars 978.

The top shield plate 984 can cover most of the top die active side 972 but is not directly above the top interconnects 974 attached to the top die active side 972 and connecting the top integrated circuit 970 to the substrate 902. The top shield-spacer 976 can further include a top shield extension 986. The top shield extension 986 can extend below the top shield pillars 978 toward the top die active side 972 of the top integrated circuit 970.

The top shield pillars 978, the top shield tie bars 980, the top shield plate 984, and the top shield extension 986 can be fabricated integrally from the same material or can be a combination of conductive materials to form the top shield-spacer 976. The top shield-spacer 976 can be an electrically conductive material such as a metal, a metal and non-metal combination, a metal alloy, or a conductive polymer.

The top shield-spacer 976 can be attached to the top die active side 972 of the top integrated circuit 970 with a top adhesive 988. The top adhesive 988 can be electrically and thermally conductive or can be electrically isolative but thermally conductive depending on whether the top integrated circuit 970 is designed to interface electrically with the top shield-spacer 976. As an example of the top integrated circuit 970 interfacing electrically with the top shield-spacer 976, the top integrated circuit 970 can be grounded through the top shield-spacer 976.

An encapsulation 990 can be formed around the bottom shield-spacer 912, the middle shield-spacer 948, and the top shield-spacer 976. The encapsulation 990 is defined as a structure that protects sensitive components from moisture, dust and other contamination. The encapsulation 990 can be glob top, film assist molding, or other encasement structure. The encapsulation 990 can be formed with the top shield plate 984, the top shield tie bars 980, and the top shield protuberance 982 exposed from the encapsulation 990.

The encapsulation 990 further encases the bottom interconnects 910, the middle interconnects 946, the top interconnects 974, the bottom integrated circuit 904, the middle integrated circuit 940, and the top integrated circuit 970. The encapsulation 990 can be formed over the substrate 902. External interconnects 992 can be formed below the substrate 902 for further interconnection.

Figure 10:
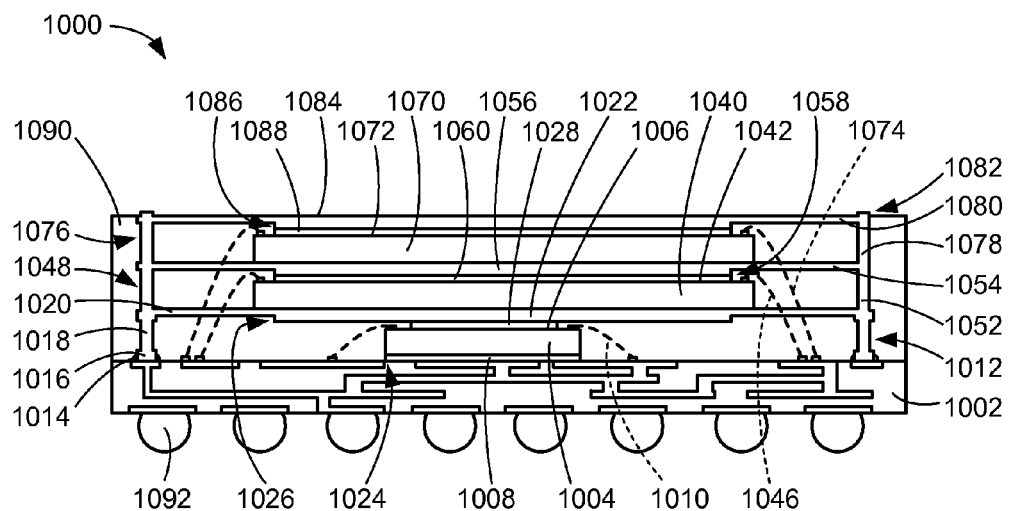
FIG. 10 is a cross-sectional view of an integrated circuit packaging system in a third embodiment of the present invention.

Referring now to FIG. 10, therein is shown a cross-sectional view of an integrated circuit packaging system 1000 in a third embodiment of the present invention. The integrated circuit packaging system 1000 is shown having a substrate 1002. The substrate 1002 is defined as a structure capable of electrical connection, signal routing with internal signal to signal isolation, and providing structural support for components to be mounted thereto. The substrate 1002 can be a laminated plastic substrate or ceramic substrate.

A bottom integrated circuit 1004 is mounted above and to the substrate 1002. The bottom integrated circuit 1004 can be mounted with a bottom die active side 1006 of the bottom integrated circuit 1004 facing away from the substrate 1002. The bottom die active side 1006 is defined as a surface having active circuitry fabricated thereon.

The bottom integrated circuit 1004 can be attached to the substrate 1002 with a bottom die attach adhesive 1008. The bottom integrated circuit 1004 can be connected to the substrate 1002 with bottom interconnects 1010. The bottom interconnects 1010 can be in direct contact with the bottom die active side 1006 of the bottom integrated circuit 1004 and connected between the bottom die active side 1006 and the substrate 1002.

A bottom shield-spacer 1012 can be attached to the substrate 1002 peripheral to the bottom integrated circuit 1004. The bottom shield-spacer 1012 can extend from the substrate 1002 above the bottom die active side 1006 of the bottom integrated circuit 1004. The bottom shield-spacer 1012 can also extend from the substrate 1002 above the bottom interconnects 1010.

The bottom shield-spacer 1012 can be attached to the substrate 1002 with a conductive adhesive 1014 in direct contact with the bottom shield-spacer 1012 and the substrate 1002. The conductive adhesive 1014 can be a metal alloy, a mixture of metallic and non-metallic substances, or conductive polymer and can be both thermally and electrically conductive. The bottom shield-spacer 1012 can be grounded through the substrate 1002.

The bottom shield-spacer 1012 can include bottom shield feet 1016 extending laterally, parallel to the substrate 1002. The bottom shield feet 1016 can be flat bottomed or include a male protuberance, female protuberance, or a through hole, all described in greater detail below. The bottom shield-spacer 1012 can further include bottom shield pillars 1018 extending vertically from the bottom shield feet 1016. The bottom shield feet 1016 can provide greater surface area for attachment between the bottom shield-spacer 1012 and the substrate 1002 than connecting the bottom shield pillars 1018 directly to the substrate 1002.

The bottom shield-spacer 1012 can further include bottom shield tie bars 1020. The bottom shield pillars 1018 can extend from the bottom shield feet 1016 to the bottom shield tie bars 1020 or can extend above the bottom shield tie bars 1020.

The bottom shield-spacer 1012 can further include a bottom shield plate 1022. The bottom shield plate 1022 can be horizontally fixed over the bottom die active side 1006 and connect between the bottom shield tie bars 1020. The bottom shield tie bars 1020 can extend horizontally from the bottom shield plate 1022 and away from corner regions 1024 of the bottom integrated circuit 1004 and do not cover or extend directly above the bottom interconnects 1010.

The bottom shield tie bars 1020 can extend horizontally to the bottom shield pillars 1018 and planar with the bottom shield pillars 1018. The bottom shield tie bars 1020 can also extend horizontally beyond the bottom shield pillars 1018 and overhanging the bottom shield pillars 1018.

The bottom shield plate 1022 can cover the bottom die active side 1006 to shield the bottom integrated circuit 1004 from noise, and harmonic interference. The bottom shield-spacer 1012 can further include a bottom shield extension 1026. The bottom shield extension 1026 can extend below the bottom shield plate 1022 toward the bottom die active side 1006 of the bottom integrated circuit 1004.

The bottom shield feet 1016, the bottom shield pillars 1018, the bottom shield tie bars 1020, the bottom shield plate 1022, and the bottom shield extension 1026 can be fabricated integrally from the same material or can be a combination of conductive materials to form the bottom shield-spacer 1012. The bottom shield-spacer 1012 can be an electrically conductive material such as a metal, a metal and non-metal combination, a metal alloy, or a conductive polymer.

The bottom shield extension 1026 of the bottom shield-spacer 1012 can be attached to the bottom die active side 1006 of the bottom integrated circuit 1004 with a bottom adhesive 1028 therebetween. The bottom adhesive 1028 can be electrically and thermally conductive or can be electrically isolative but thermally conductive depending on whether the bottom integrated circuit 1004 is designed to interface electrically with the bottom shield-spacer 1012. As an example of the bottom integrated circuit 1004 interfacing electrically with the bottom shield-spacer 1012, the bottom integrated circuit 1004 can be grounded through the bottom shield-spacer 1012.

A middle integrated circuit 1040 is mounted above the substrate 1002 and above the bottom integrated circuit 1004. The middle integrated circuit 1040 can be mounted with a middle die active side 1042 of the middle integrated circuit 1040 facing away from the substrate 1002. The middle die active side 1042 is defined as a surface having active circuitry fabricated thereon.

The middle integrated circuit 1040 can be directly contacting the bottom shield-spacer 1012. The middle integrated circuit 1040 can be connected to the substrate 1002 with middle interconnects 1046. The middle interconnects 1046 can be in direct contact with the middle die active side 1042 of the middle integrated circuit 1040 and connected between the middle integrated circuit 1040 and the substrate 1002.

A middle shield-spacer 1048 can be attached to the bottom shield-spacer 1012 peripheral to the middle integrated circuit 1040. The middle shield-spacer 1048 can extend from the bottom shield tie bars 1020 and the bottom shield pillars 1018 above the middle die active side 1042 of the middle integrated circuit 1040. The middle shield-spacer 1048 can also extend from the bottom shield-spacer 1012 above the middle interconnects 1046.

The middle shield-spacer 1048 can be attached to the bottom shield-spacer 1012 with a conductive adhesive or can be attached to the bottom shield-spacer 1012 with a male protuberance, a female protuberance or a combination of all three. The middle shield-spacer 1048 can be grounded through electrical connection with the bottom shield-spacer 1012 and the substrate 1002.

The middle shield-spacer 1048 can include middle shield pillars 1052 extending vertically from the bottom shield pillars 1018 and the bottom shield tie bars 1020. The middle shield-spacer 1048 can further include middle shield tie bars 1054. The middle shield pillars 1052 can extend from the bottom shield pillars 1018 to the middle shield tie bars 1054 or can extend above the middle shield tie bars 1054.

The middle shield-spacer 1048 can further include a middle shield plate 1056. The middle shield plate 1056 can be horizontally fixed over the middle die active side 1042 and extend between the middle shield tie bars 1054. The middle shield tie bars 1054 can extend from the middle shield plate 1056 diagonally away from the middle integrated circuit 1040 and do not cover or extend directly above the middle interconnects 1046.

The middle shield tie bars 1054 can extend horizontally to the middle shield pillars 1052 and planar with the middle shield pillars 1052. The middle shield tie bars 1054 can also extend horizontally beyond the middle shield pillars 1052 and overhanging the middle shield pillars 1052.

The middle shield plate 1056 can cover most of the middle die active side 1042 but is not directly above the middle interconnects 1046 attached to the middle die active side 1042 and connecting the middle integrated circuit 1040 to the substrate 1002. The middle shield-spacer 1048 can further include a middle shield extension 1058. The middle shield extension 1058 can extend below the middle shield plate 1056 toward the middle die active side 1042 of the middle integrated circuit 1040.

The middle shield pillars 1052, the middle shield tie bars 1054, the middle shield plate 1056, and the middle shield extension 1058 can be fabricated integrally from the same material or can be a combination of conductive materials to form the middle shield-spacer 1048. The middle shield-spacer 1048 can be an electrically conductive material such as a metal, a metal and non-metal combination, a metal alloy, or a conductive polymer.

The middle shield-spacer 1048 can be attached to the middle die active side 1042 of the middle integrated circuit 1040 with a middle adhesive 1060. The middle adhesive 1060 can be electrically and thermally conductive or can be electrically isolative but thermally conductive depending on whether the middle integrated circuit 1040 is designed to interface electrically with the middle shield-spacer 1048. As an example of the middle integrated circuit 1040 interfacing electrically with the middle shield-spacer 1048, the middle integrated circuit 1040 can be grounded through the middle shield-spacer 1048.

A top integrated circuit 1070 is mounted above the middle integrated circuit 1040, the middle shield-spacer 1048, the bottom integrated circuit 1004, the bottom shield-spacer 1012, and the substrate 1002. The top integrated circuit 1070 can be mounted with a top die active side 1072 of the top integrated circuit 1070 facing away from the substrate 1002. The top die active side 1072 is defined as a surface having active circuitry fabricated thereon.

The top integrated circuit 1070 can be mounted above the middle shield-spacer 1048. The top integrated circuit 1070 can be in direct contact with the middle shield-spacer 1048. The top integrated circuit 1070 can be connected to the substrate 1002 with top interconnects 1074. The top interconnects 1074 can be in direct contact with the top die active side 1072 of the top integrated circuit 1070 and connected between the top integrated circuit 1070 and the substrate 1002.

A top shield-spacer 1076 can be attached to the middle shield-spacer 1048 peripheral to the top integrated circuit 1070. The top shield-spacer 1076 can extend from the middle shield tie bars 1054 and the middle shield pillars 1052 of the middle shield-spacer 1048 above the top die active side 1072 of the top integrated circuit 1070. The top shield-spacer 1076 can also extend from the middle shield-spacer 1048 above the top interconnects 1074.

The top shield-spacer 1076 can be attached to the middle shield-spacer 1048 with a conductive adhesive or can be attached to the bottom shield-spacer 1012 with a male protuberance, a female protuberance or a combination of all three. The top die active side 1072 can be grounded through electrical connection with the middle shield-spacer 1048, the bottom shield-spacer 1012, and the substrate 1002.

It has been discovered that utilizing the top shield-spacer 1076, the bottom shield-spacer 1012, or the middle shield-spacer 1048 in combination with the bottom integrated circuit 1004, the middle integrated circuit 1040, or the top integrated circuit 1070 reduces package height, serves to efficiently release heat from the package, and allows for improved wire bonding capability since the bottom shield tie bars 1020 or the middle shield tie bars 1054 do not encumber the bottom interconnects 1010 or the middle interconnects 1046.

It has further been discovered that utilizing the top shield-spacer 1076, the bottom shield-spacer 1012, or the middle shield-spacer 1048 reduces noise, cross talk, and other effects between the bottom integrated circuit 1004, the middle integrated circuit 1040, and the top integrated circuit 1070 while simultaneously providing a more efficient grounding plane.

The top shield-spacer 1076 can include top shield pillars 1078 extending vertically from the middle shield pillars 1052 or the middle shield tie bars 1054. The top shield-spacer 1076 can further include top shield tie bars 1080. The top shield pillars 1078 can extend from the middle shield tie bars 1054 or the middle shield pillars 1052 to the top shield tie bars 1080 or can extend above the top shield tie bars 1080.

The top shield-spacer 1076 can further include a top shield protuberance 1082. The top shield protuberance 1082 can include a male protuberance, a female protuberance or a combination of both.

The top shield-spacer 1076 can further include a top shield plate 1084. The top shield plate 1084 can be horizontally fixed over the top integrated circuit 1070 and extend between the top shield tie bars 1080. The top shield tie bars 1080 can extend from the top shield plate 1084 diagonally away from the top integrated circuit 1070 and do not cover or extend directly above the middle interconnects 1046 or the top interconnects 1074.

The top shield tie bars 1080 can extend horizontally to the top shield pillars 1078 and planar with the top shield pillars 1078. The top shield tie bars 1080 can also extend horizontally beyond the top shield pillars 1078 and overhanging the top shield pillars 1078.

The top shield plate 1084 can cover most of the top die active side 1072 but is not directly above the top interconnects 1074 attached to the top die active side 1072 and connecting the top integrated circuit 1070 to the substrate 1002. The top shield-spacer 1076 can further include a top shield extension 1086. The top shield extension 1086 can extend below the top shield pillars 1078 toward the top die active side 1072 of the top integrated circuit 1070.

The top shield pillars 1078, the top shield tie bars 1080, the top shield plate 1084, and the top shield extension 1086 can be fabricated integrally from the same material or can be a combination of conductive materials to form the top shield-spacer 1076. The top shield-spacer 1076 can be an electrically conductive material such as a metal, a metal and non-metal combination, a metal alloy, or a conductive polymer.

The top shield-spacer 1076 can be attached to the top die active side 1072 of the top integrated circuit 1070 with a top adhesive 1088. The top adhesive 1088 can be electrically and thermally conductive or can be electrically isolative but thermally conductive depending on whether the top integrated circuit 1070 is designed to interface electrically with the top shield-spacer 1076. As an example of the top integrated circuit 1070 interfacing electrically with the top shield-spacer 1076, the top integrated circuit 1070 can be grounded through the top shield-spacer 1076.

An encapsulation 1090 can be formed around the bottom shield-spacer 1012, the middle shield-spacer 1048, and the top shield-spacer 1076. The encapsulation 1090 is defined as a structure that protects sensitive components from moisture, dust and other contamination. The encapsulation 1090 can be glob top, film assist molding, or other encasement structure. The encapsulation 1090 can be formed with the top shield plate 1084, the top shield tie bars 1080, and the top shield protuberance 1082 exposed from the encapsulation 1090.

The encapsulation 1090 further encases the bottom interconnects 1010, the middle interconnects 1046, the top interconnects 1074, the bottom integrated circuit 1004, the middle integrated circuit 1040, and the top integrated circuit 1070. The encapsulation 1090 can be formed over the substrate 1002. External interconnects 1092 can be formed below the substrate 1002 for further interconnection.

Figure 11:
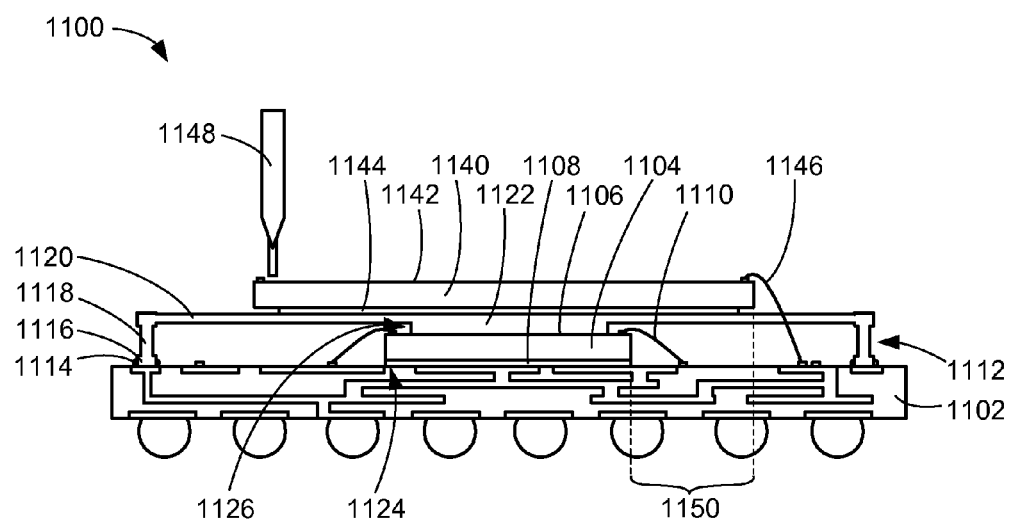
FIG. 11 is a cross-sectional view of the integrated circuit packaging system in a fourth embodiment of the present invention and during a middle wire bonding phase of manufacture.

Referring now to FIG. 11, therein is shown a cross-sectional view of the integrated circuit packaging system 1100 in a fourth embodiment of the present invention and during a middle wire bonding phase of manufacture. The integrated circuit packaging system 1100 is shown having a substrate 1102. The substrate 1102 is defined as a structure capable of electrical connection, signal routing with internal signal to signal isolation, and providing structural support for components to be mounted thereto. The substrate 1102 can be a laminated plastic substrate or ceramic substrate.

A bottom integrated circuit 1104 is mounted above and to the substrate 1102. The bottom integrated circuit 1104 can be mounted with a bottom die active side 1106 of the bottom integrated circuit 1104 facing away from the substrate 1102. The bottom die active side 1106 is defined as a surface having active circuitry fabricated thereon.

The bottom integrated circuit 1104 can be attached to the substrate 1102 with a bottom die attach adhesive 1108. The bottom integrated circuit 1104 can be connected to the substrate 1102 with bottom interconnects 1110. The bottom interconnects 1110 can be in direct contact with the bottom die active side 1106 of the bottom integrated circuit 1104 and connected between the bottom die active side 1106 and the substrate 1102.

A bottom shield-spacer 1112 can be attached to the substrate 1102 peripheral to the bottom integrated circuit 1104. The bottom shield-spacer 1112 can extend from the substrate 1102 above the bottom die active side 1106 of the bottom integrated circuit 1104. The bottom shield-spacer 1112 can also extend from the substrate 1102 above the bottom interconnects 1110.

The bottom shield-spacer 1112 can be attached to the substrate 1102 with a conductive adhesive 1114 in direct contact with the bottom shield-spacer 1112 and the substrate 1102. The conductive adhesive 1114 can be a metal alloy, a mixture of metallic and non-metallic substances, or conductive polymer and can be both thermally and electrically conductive. The bottom shield-spacer 1112 can be grounded through the substrate 1102.

The bottom shield-spacer 1112 can include bottom shield feet 1116 extending laterally, parallel to the substrate 1102. The bottom shield feet 1116 can be flat bottomed or include a male protuberance, female protuberance, or a through hole, all described in greater detail below. The bottom shield-spacer 1112 can further include bottom shield pillars 1118 extending vertically from the bottom shield feet 1116. The bottom shield feet 1116 can provide greater surface area for attachment between the bottom shield-spacer 1112 and the substrate 1102 than connecting the bottom shield pillars 1118 directly to the substrate 1102.

The bottom shield-spacer 1112 can further include bottom shield tie bars 1120. The bottom shield pillars 1118 can extend from the bottom shield feet 1116 to the bottom shield tie bars 1120 or can extend above the bottom shield tie bars 1120.

The bottom shield-spacer 1112 can further include a bottom shield plate 1122. The bottom shield plate 1122 can be horizontally fixed over the bottom die active side 1106 and connect between the bottom shield tie bars 1120. The bottom shield tie bars 1120 can extend horizontally from the bottom shield plate 1122 and away from corner regions 1124 of the bottom integrated circuit 1104 and do not cover or extend directly above the bottom interconnects 1110.

The bottom shield tie bars 1120 can extend horizontally to the bottom shield pillars 1118 and planar with the bottom shield pillars 1118. The bottom shield tie bars 1120 can also extend horizontally beyond the bottom shield pillars 1118 and overhanging the bottom shield pillars 1118.

The bottom shield plate 1122 can cover most of the bottom die active side 1106 but is not directly above the bottom interconnects 1110 attached to the bottom die active side 1106 and connecting the bottom integrated circuit 1104 to the substrate 1102. The bottom shield-spacer 1112 can further include a bottom shield extension 1126. The bottom shield extension 1126 can extend below the bottom shield plate 1122 toward the bottom die active side 1106 of the bottom integrated circuit 1104.

The bottom shield feet 1116, the bottom shield pillars 1118, the bottom shield tie bars 1120, the bottom shield plate 1122, and the bottom shield extension 1126 can be fabricated integrally from the same material or can be a combination of conductive materials to form the bottom shield-spacer 1112. The bottom shield-spacer 1112 can be an electrically conductive material such as a metal, a metal and non-metal combination, a metal alloy, or a conductive polymer.

The bottom shield extension 1126 of the bottom shield-spacer 1112 can be in direct contact with the bottom die active side 1106 of the bottom integrated circuit 1104. A middle integrated circuit 1140 is mounted above the substrate 1102 and above the bottom integrated circuit 1104. The middle integrated circuit 1140 can be mounted with a middle die active side 1142 of the middle integrated circuit 1140 facing away from the substrate 1102. The middle die active side 1142 is defined as a surface having active circuitry fabricated thereon.

It has been discovered that utilizing the bottom shield-spacer 1112 reduces package height, serves to efficiently release heat from the package, and allows for improved wire bonding capability since the bottom shield tie bars 1120 do not encumber the bottom interconnects 1110. It has further been discovered that utilizing the bottom shield-spacer 1112 reduces noise, cross talk, and other effects between the bottom integrated circuit 1104 and the middle integrated circuit 1140 while simultaneously providing a more efficient grounding plane.

The middle integrated circuit 1140 can be attached to the bottom shield-spacer 1112 with a middle die attach adhesive 1144. The middle integrated circuit 1140 can be connected to the substrate 1102 with middle interconnects 1146. The middle integrated circuit 1140 can be connected to the substrate 1102 with middle interconnects 1146. The middle interconnects 1146 can be in direct contact with the middle die active side 1142 of the middle integrated circuit 1140 and connected between the middle integrated circuit 1140 and the substrate 1102.

A capillary 1148 can be utilized to affix the middle interconnects 1146 to the middle integrated circuit 1140 and the substrate 1102. The middle integrated circuit 1140 can have an overhang 1150 above the bottom integrated circuit 1104. The overhang 1150 of the middle integrated circuit 1140 can be supported by the bottom shield-spacer 1112 over the bottom integrated circuit 1104.

It has been discovered that the bottom shield-spacer 1112 over the bottom integrated circuit 1104 supporting the middle integrated circuit 1140 when the middle interconnects 1146 are being connected provides additional support and stability allowing for the overhang 1150 to be larger. It has further been discovered that the bottom shield-spacer 1112 over the bottom integrated circuit 1104 supporting the middle integrated circuit 1140 when the middle interconnects 1146 are being formed allows for increased design flexibility and decreased cost for specialized package designs.

Figure 12:
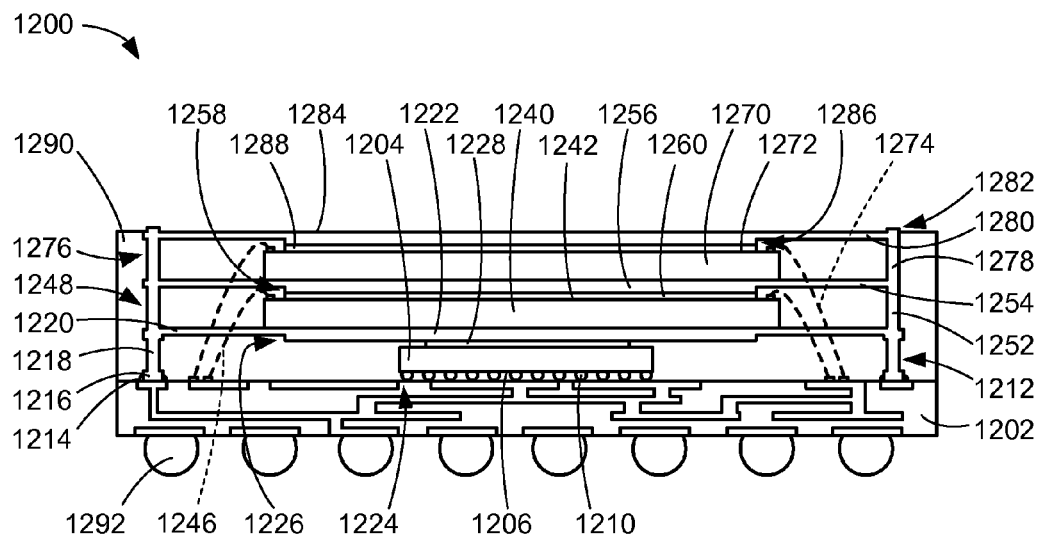
FIG. 12 is a cross-sectional view of an integrated circuit packaging system in fifth embodiment of the present invention.

Referring now to FIG. 12, therein is shown a cross-sectional view of an integrated circuit packaging system 1200 in fifth embodiment of the present invention. The integrated circuit packaging system 1200 is shown having a substrate 1202. The substrate 1202 is defined as a structure capable of electrical connection, signal routing with internal signal to signal isolation, and providing structural support for components to be mounted thereto. The substrate 1202 can be a laminated plastic substrate or ceramic substrate.

A bottom integrated circuit 1204 is mounted above and to the substrate 1202. The bottom integrated circuit 1204 can be mounted with a bottom die active side 1206 of the bottom integrated circuit 1204 facing toward the substrate 1202. The bottom die active side 1206 is defined as a surface having active circuitry fabricated thereon.

The bottom integrated circuit 1204 can be connected to the substrate 1202 with bottom interconnects 1210. The bottom interconnects 1210 can be in direct contact with the bottom die active side 1206 of the bottom integrated circuit 1204 and connected between the bottom die active side 1206 and the substrate 1202.

A bottom shield-spacer 1212 can be attached to the substrate 1202 peripheral to the bottom integrated circuit 1204. The bottom shield-spacer 1212 can extend from the substrate 1202 above the bottom die active side 1206 of the bottom integrated circuit 1204. The bottom shield-spacer 1212 can also extend from the substrate 1202 above the bottom interconnects 1210.

The bottom shield-spacer 1212 can be attached to the substrate 1202 with a conductive adhesive 1214 in direct contact with the bottom shield-spacer 1212 and the substrate 1202. The conductive adhesive 1214 can be a metal alloy, a mixture of metallic and non-metallic substances, or conductive polymer and can be both thermally and electrically conductive. The bottom shield-spacer 1212 can be grounded through the substrate 1202.

The bottom shield-spacer 1212 can include bottom shield feet 1216 extending laterally, parallel to the substrate 1202. The bottom shield feet 1216 can be flat bottomed or include a male protuberance, female protuberance, or a through hole, all described in greater detail below. The bottom shield-spacer 1212 can further include bottom shield pillars 1218 extending vertically from the bottom shield feet 1216. The bottom shield feet 1216 can provide greater surface area for attachment between the bottom shield-spacer 1212 and the substrate 1202 than connecting the bottom shield pillars 1218 directly to the substrate 1202.

The bottom shield-spacer 1212 can further include bottom shield tie bars 1220. The bottom shield pillars 1218 can extend from the bottom shield feet 1216 to the bottom shield tie bars 1220 or can extend above the bottom shield tie bars 1220.

The bottom shield-spacer 1212 can further include a bottom shield plate 1222. The bottom shield plate 1222 can be horizontally fixed over the bottom die active side 1206 and connect between the bottom shield tie bars 1220. The bottom shield tie bars 1220 can extend horizontally from the bottom shield plate 1222 and away from corner regions 1224 of the bottom integrated circuit 1204.

The bottom shield tie bars 1220 can extend horizontally to the bottom shield pillars 1218 and planar with the bottom shield pillars 1218. The bottom shield tie bars 1220 can also extend horizontally beyond the bottom shield pillars 1218 and overhanging the bottom shield pillars 1218.

The bottom shield plate 1222 can cover the bottom integrated circuit 1204 to shield the bottom integrated circuit 1204 from noise, and harmonic interference. The bottom shield-spacer 1212 can further include a bottom shield extension 1226. The bottom shield extension 1226 can extend below the bottom shield plate 1222 toward the bottom die active side 1206 of the bottom integrated circuit 1204.

The bottom shield feet 1216, the bottom shield pillars 1218, the bottom shield tie bars 1220, the bottom shield plate 1222, and the bottom shield extension 1226 can be fabricated integrally from the same material or can be a combination of conductive materials to form the bottom shield-spacer 1212. The bottom shield-spacer 1212 can be an electrically conductive material such as a metal, a metal and non-metal combination, a metal alloy, or a conductive polymer.

The bottom shield extension 1226 of the bottom shield-spacer 1212 can be attached to the bottom integrated circuit 1204 with a bottom adhesive 1228 therebetween. The bottom adhesive 1228 can be electrically and thermally conductive or can be electrically isolative but thermally conductive.

A middle integrated circuit 1240 is mounted above the substrate 1202 and above the bottom integrated circuit 1204. The middle integrated circuit 1240 can be mounted with a middle die active side 1242 of the middle integrated circuit 1240 facing away from the substrate 1202. The middle die active side 1242 is defined as a surface having active circuitry fabricated thereon.

The middle integrated circuit 1240 can be directly contacting the bottom shield-spacer 1212. The middle integrated circuit 1240 can be connected to the substrate 1202 with middle interconnects 1246. The middle interconnects 1246 can be in direct contact with the middle die active side 1242 of the middle integrated circuit 1240 and connected between the middle integrated circuit 1240 and the substrate 1202.

A middle shield-spacer 1248 can be attached to the bottom shield-spacer 1212 peripheral to the middle integrated circuit 1240. The middle shield-spacer 1248 can extend from the bottom shield tie bars 1220 and the bottom shield pillars 1218 above the middle die active side 1242 of the middle integrated circuit 1240. The middle shield-spacer 1248 can also extend from the bottom shield-spacer 1212 above the middle interconnects 1246.

The middle shield-spacer 1248 can be attached to the bottom shield-spacer 1212 with a conductive adhesive or can be attached to the bottom shield-spacer 1212 with a male protuberance, a female protuberance or a combination of all three. The middle shield-spacer 1248 can be grounded through electrical connection with the bottom shield-spacer 1212 and the substrate 1202.

The middle shield-spacer 1248 can include middle shield pillars 1252 extending vertically from the bottom shield pillars 1218 and the bottom shield tie bars 1220. The middle shield-spacer 1248 can further include middle shield tie bars 1254. The middle shield pillars 1252 can extend from the bottom shield pillars 1218 to the middle shield tie bars 1254 or can extend above the middle shield tie bars 1254.

The middle shield-spacer 1248 can further include a middle shield plate 1256. The middle shield plate 1256 can be horizontally fixed over the middle die active side 1242 and extend between the middle shield tie bars 1254. The middle shield tie bars 1254 can extend from the middle shield plate 1256 diagonally away from the middle integrated circuit 1240 and do not cover or extend directly above the middle interconnects 1246.

The middle shield tie bars 1254 can extend horizontally to the middle shield pillars 1252 and planar with the middle shield pillars 1252. The middle shield tie bars 1254 can also extend horizontally beyond the middle shield pillars 1252 and overhanging the middle shield pillars 1252.

The middle shield plate 1256 can cover most of the middle die active side 1242 but is not directly above the middle interconnects 1246 attached to the middle die active side 1242 and connecting the middle integrated circuit 1240 to the substrate 1202. The middle shield-spacer 1248 can further include a middle shield extension 1258. The middle shield extension 1258 can extend below the middle shield plate 1256 toward the middle die active side 1242 of the middle integrated circuit 1240.

The middle shield pillars 1252, the middle shield tie bars 1254, the middle shield plate 1256, and the middle shield extension 1258 can be fabricated integrally from the same material or can be a combination of conductive materials to form the middle shield-spacer 1248. The middle shield-spacer 1248 can be an electrically conductive material such as a metal, a metal and non-metal combination, a metal alloy, or a conductive polymer.

The middle shield-spacer 1248 can be attached to the middle die active side 1242 of the middle integrated circuit 1240 with a middle adhesive 1260. The middle adhesive 1260 can be electrically and thermally conductive or can be electrically isolative but thermally conductive depending on whether the middle integrated circuit 1240 is designed to interface electrically with the middle shield-spacer 1248. As an example of the middle integrated circuit 1240 interfacing electrically with the middle shield-spacer 1248, the middle integrated circuit 1240 can be grounded through the middle shield-spacer 1248.

A top integrated circuit 1270 is mounted above the middle integrated circuit 1240, the middle shield-spacer 1248, the bottom integrated circuit 1204, the bottom shield-spacer 1212, and the substrate 1202. The top integrated circuit 1270 can be mounted with a top die active side 1272 of the top integrated circuit 1270 facing away from the substrate 1202. The top die active side 1272 is defined as a surface having active circuitry fabricated thereon.

The top integrated circuit 1270 can be mounted above the middle shield-spacer 1248. The top integrated circuit 1270 can be in direct contact with the middle shield-spacer 1248. The top integrated circuit 1270 can be connected to the substrate 1202 with top interconnects 1274. The top interconnects 1274 can be in direct contact with the top die active side 1272 of the top integrated circuit 1270 and connected between the top integrated circuit 1270 and the substrate 1202.

A top shield-spacer 1276 can be attached to the middle shield-spacer 1248 peripheral to the top integrated circuit 1270. The top shield-spacer 1276 can extend from the middle shield tie bars 1254 and the middle shield pillars 1252 of the middle shield-spacer 1248 above the top die active side 1272 of the top integrated circuit 1270. The top shield-spacer 1276 can also extend from the middle shield-spacer 1248 above the top interconnects 1274.

The top shield-spacer 1276 can be attached to the middle shield-spacer 1248 with a conductive adhesive or can be attached to the bottom shield-spacer 1212 with a male protuberance, a female protuberance or a combination of all three. The top die active side 1272 can be grounded through electrical connection with the middle shield-spacer 1248, the bottom shield-spacer 1212, and the substrate 1202.

It has been discovered that utilizing the top shield-spacer 1276, the bottom shield-spacer 1212, or the middle shield-spacer 1248 in combination with the bottom integrated circuit 1204, the middle integrated circuit 1240, or the top integrated circuit 1270 reduces package height, serves to efficiently release heat from the package, and allows for improved wire bonding capability since the bottom shield tie bars 1220 or the middle shield tie bars 1254 do not encumber the middle interconnects 1246. It has further been discovered that utilizing the top shield-spacer 1276, the bottom shield-spacer 1212, or the middle shield-spacer 1248 reduces noise, cross talk, and other effects between the bottom integrated circuit 1204, the middle integrated circuit 1240, and the top integrated circuit 1270 while simultaneously providing a more efficient grounding plane.

The top shield-spacer 1276 can include top shield pillars 1278 extending vertically from the middle shield pillars 1252 or the middle shield tie bars 1254. The top shield-spacer 1276 can further include top shield tie bars 1280. The top shield pillars 1278 can extend from the middle shield tie bars 1254 or the middle shield pillars 1252 to the top shield tie bars 1280 or can extend above the top shield tie bars 1280.

The top shield-spacer 1276 can further include a top shield protuberance 1282. The top shield protuberance 1282 can include a male protuberance, a female protuberance or a combination of both.

The top shield-spacer 1276 can further include a top shield plate 1284. The top shield plate 1284 can be horizontally fixed over the top integrated circuit 1270 and extend between the top shield tie bars 1280. The top shield tie bars 1280 can extend from the top shield plate 1284 diagonally away from the top integrated circuit 1270 and do not cover or extend directly above the middle interconnects 1246 or the top interconnects 1274.

The top shield tie bars 1280 can extend horizontally to the top shield pillars 1278 and planar with the top shield pillars 1278. The top shield tie bars 1280 can also extend horizontally beyond the top shield pillars 1278 and overhanging the top shield pillars 1278.

The top shield plate 1284 can cover most of the top die active side 1272 but is not directly above the top interconnects 1274 attached to the top die active side 1272 and connecting the top integrated circuit 1270 to the substrate 1202. The top shield-spacer 1276 can further include a top shield extension 1286. The top shield extension 1286 can extend below the top shield pillars 1278 toward the top die active side 1272 of the top integrated circuit 1270.

The top shield pillars 1278, the top shield tie bars 1280, the top shield plate 1284, and the top shield extension 1286 can be fabricated integrally from the same material or can be a combination of conductive materials to form the top shield-spacer 1276. The top shield-spacer 1276 can be an electrically conductive material such as a metal, a metal and non-metal combination, a metal alloy, or a conductive polymer.

The top shield-spacer 1276 can be attached to the top die active side 1272 of the top integrated circuit 1270 with a top adhesive 1288. The top adhesive 1288 can be electrically and thermally conductive or can be electrically isolative but thermally conductive depending on whether the top integrated circuit 1270 is designed to interface electrically with the top shield-spacer 1276. As an example of the top integrated circuit 1270 interfacing electrically with the top shield-spacer 1276, the top integrated circuit 1270 can be grounded through the top shield-spacer 1276.

An encapsulation 1290 can be formed around the bottom shield-spacer 1212, the middle shield-spacer 1248, and the top shield-spacer 1276. The encapsulation 1290 is defined as a structure that protects sensitive components from moisture, dust and other contamination. The encapsulation 1290 can be glob top, film assist molding, or other encasement structure. The encapsulation 1290 can be formed with the top shield plate 1284, the top shield tie bars 1280, and the top shield protuberance 1282 exposed from the encapsulation 1290.

The encapsulation 1290 further encases the bottom interconnects 1210, the middle interconnects 1246, the top interconnects 1274, the bottom integrated circuit 1204, the middle integrated circuit 1240, and the top integrated circuit 1270. The encapsulation 1290 can be formed over the substrate 1202. External interconnects 1292 can be formed below the substrate 1202 for further interconnection.

Figure 13:
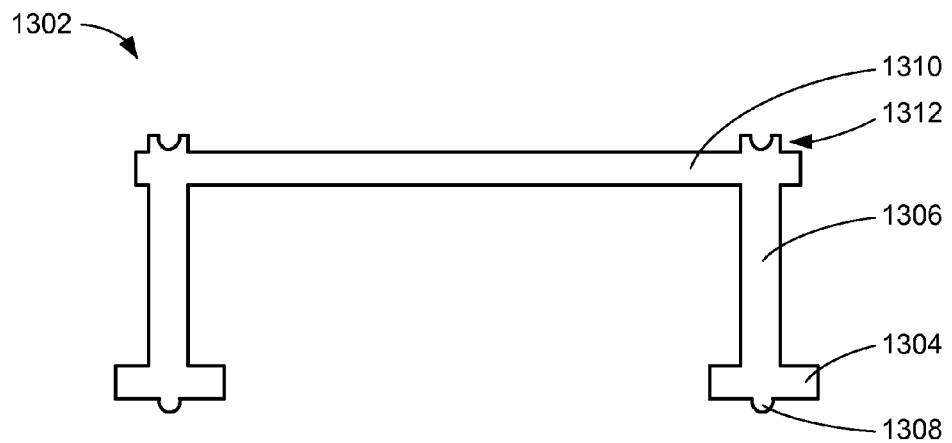
FIG. 13 is a cross-sectional view of an exemplary shield-spacer for use in an embodiment of the present invention.

Referring now to FIG. 13, therein is shown a cross-sectional view of an exemplary shield-spacer 1302 for use in an embodiment of the present invention. The exemplary shield-spacer 1302 can be the bottom shield-spacer 112 of FIG. 1, the middle shield-spacer 148 of FIG. 1, or the top shield-spacer 176 of FIG. 1. The exemplary shield-spacer 1302 is shown having shield feet 1304. The shield feet 1304 can extend horizontally from shield pillars 1306.

The shield feet 1304 can further include male protuberances 1308 extending vertically down from the shield feet 1304. The male protuberances 1308 are defined as convex extending structures.

The exemplary shield-spacer 1302 can further include shield tie bars 1310 connected to the shield pillars 1306. The shield tie bars 1310 can extend beyond the shield pillars 1306 or can be planar with the shield pillars 1306.

The exemplary shield-spacer 1302 can further include female protuberances 1312. The female protuberances 1312 are defined as concave extending structures. The female protuberances 1312 can be designed to couple with the male protuberances 1308.

Figure 14:
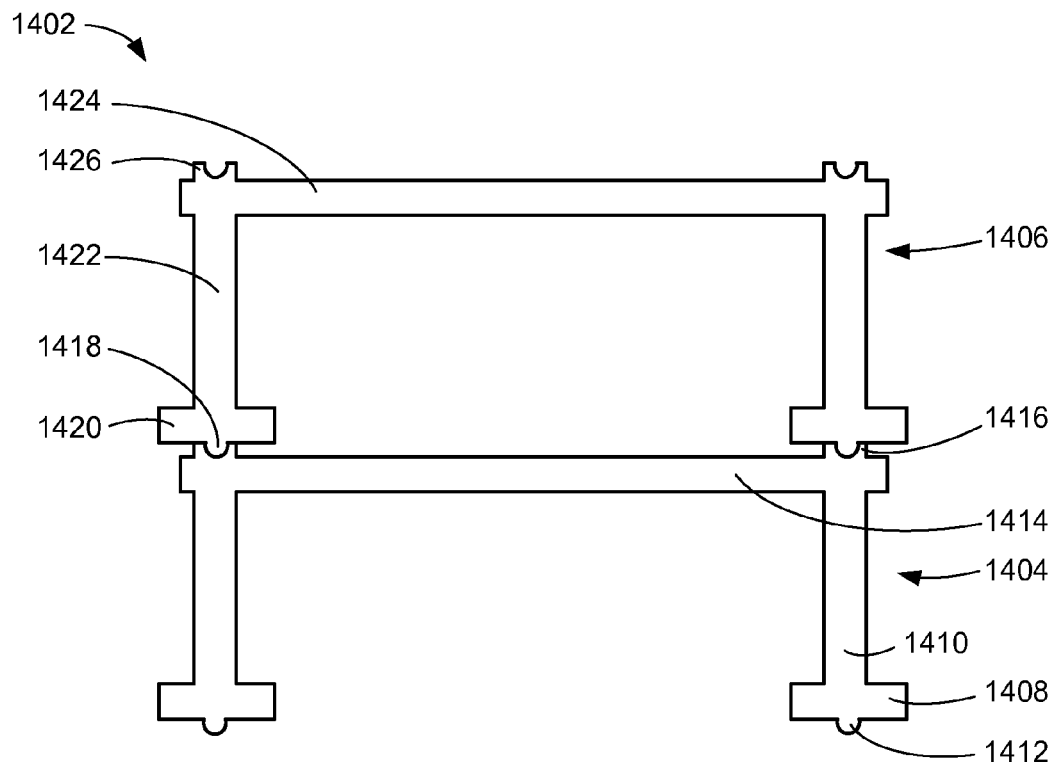
FIG. 14 is a cross-sectional view of an exemplary shield-spacer stack for use in an embodiment of the present invention.

Referring now to FIG. 14, therein is shown a cross-sectional view of an exemplary shield-spacer stack 1402 for use in an embodiment of the present invention. The exemplary shield-spacer stack 1402 is shown with only a bottom shield-spacer 1404 and a top shield-spacer 1406 for descriptive clarity and can be the bottom shield-spacer 112 of FIG. 1 and the middle shield-spacer 148 of FIG. 1, respectively.

The bottom shield-spacer 1404 is shown having bottom shield feet 1408 extending horizontally from bottom shield pillars 1410. The bottom shield-spacer 1404 can further include bottom shield male protuberances 1412. The bottom shield male protuberances 1412 are defined as convex extending structures.

The bottom shield male protuberances 1412 extend vertically down from the bottom shield feet 1408. The bottom shield pillars 1410 extend from the bottom shield feet 1408 to bottom shield tie bars 1414. The bottom shield tie bars 1414 can extend to the bottom shield pillars 1410 or beyond the bottom shield pillars 1410.

The bottom shield-spacer 1404 further includes bottom shield female protuberances 1416 extending vertically up from the bottom shield tie bars 1414. The bottom shield female protuberances 1416 are defined as concave extending structures.

The top shield-spacer 1406 can be coupled to the bottom shield female protuberances 1416 of the bottom shield-spacer 1404. The top shield-spacer 1406 can include top shield male protuberances 1418 that fit into the bottom shield female protuberances 1416.

It has been discovered that utilizing the bottom shield-spacer 1404 including the bottom shield female protuberances 1416 coupled to the top shield male protuberances 1418 of the top shield-spacer 1406 provides greater surface area and mechanical coupling for securing the top shield-spacer 1406 to the bottom shield-spacer 1404.

The top shield-spacer 1406 can further include top shield feet 1420 above the top shield male protuberances 1418. The top shield male protuberances 1418 extend vertically down from the top shield feet 1420. The top shield male protuberances 1418 are defined as convex extending structures. The top shield feet 1420 can be offset above the bottom shield tie bars 1414 by the distance of the top shield male protuberances 1418 and the bottom shield female protuberances 1416. The top shield feet 1420 of the top shield-spacer 1406 can be spaced apart from the bottom shield tie bars 1414 of the bottom shield-spacer 1404.

The top shield-spacer 1406 can further have top shield pillars 1422 extending vertically away from the top shield feet 1420 to top shield tie bars 1424. The top shield tie bars 1424 can extend to or beyond the top shield pillars 1422. The top shield-spacer 1406 can further include top shield female protuberances 1426 extending vertically away from the top shield tie bars 1424. The top shield female protuberances 1426 are defined as concave extending structures.

Figure 15:
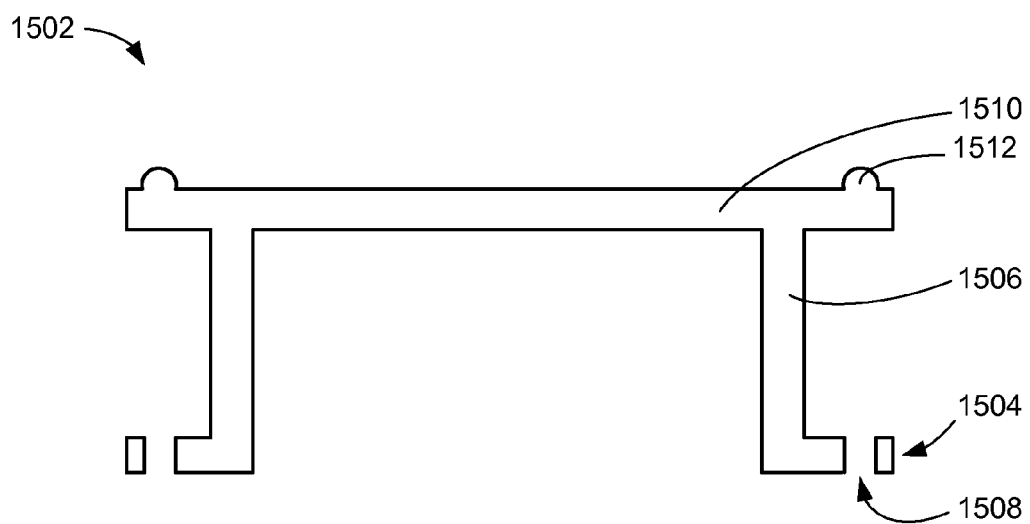
FIG. 15 is a cross-sectional view of an exemplary shield-spacer for use in an embodiment of the present invention.

Referring now to FIG. 15, therein is shown a cross-sectional view of an exemplary shield-spacer 1502 for use in an embodiment of the present invention. The exemplary shield-spacer 1502 can be the bottom shield-spacer 112 of FIG. 1, the middle shield-spacer 148 of FIG. 1, or the top shield-spacer 176 of FIG. 1. The exemplary shield-spacer 1502 is shown having shield feet 1504. The shield feet 1504 can extend horizontally from shield pillars 1506.

The shield feet 1504 can further include through holes 1508 extending vertically through the shield feet 1504. The exemplary shield-spacer 1502 can further include shield tie bars 1510 connected to the shield pillars 1506. The shield tie bars 1510 can extend beyond the shield pillars 1506 or can be planar with the shield pillars 1506.

The exemplary shield-spacer 1502 can further include male protuberances 1512. The male protuberances 1512 are defined as convex extending structures. The male protuberances 1512 can be designed to couple with the through holes 1508.

Figure 16:
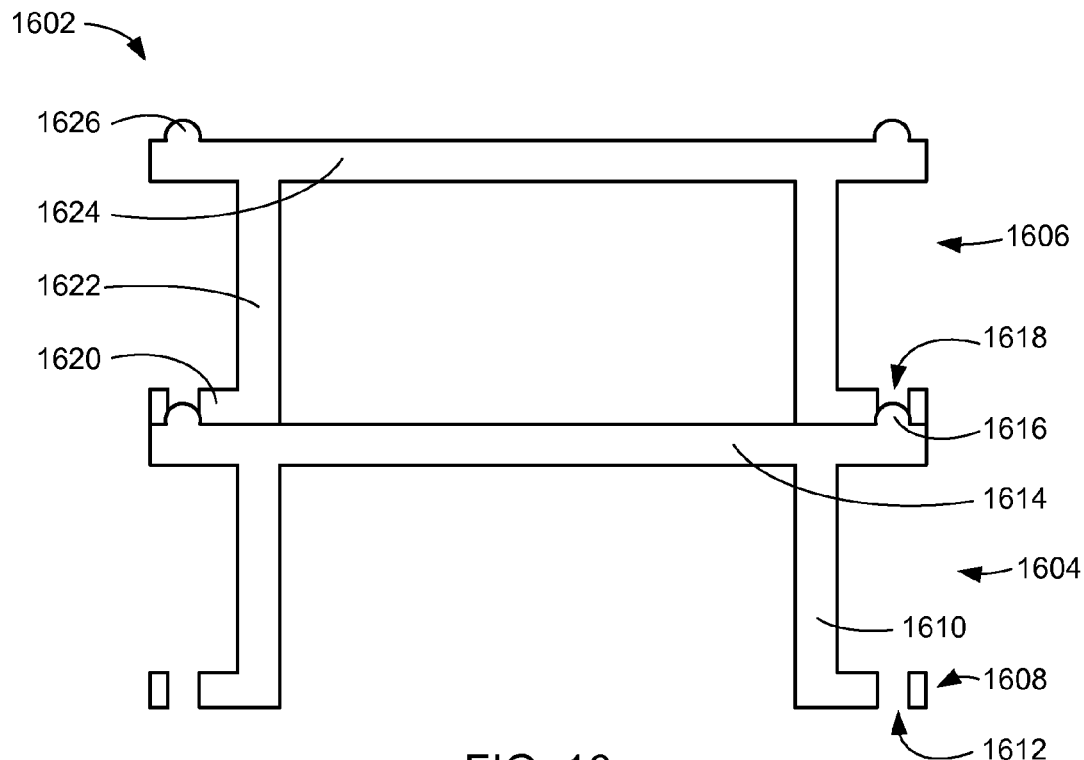
FIG. 16 is a cross-sectional view of an exemplary shield-spacer stack for use in an embodiment of the present invention.

Referring now to FIG. 16, therein is shown a cross-sectional view of an exemplary shield-spacer stack 1602 for use in an embodiment of the present invention. The exemplary shield-spacer stack 1602 is shown with only a bottom shield-spacer 1604 and a top shield-spacer 1606 for descriptive clarity and can be the bottom shield-spacer 112 of FIG. 1 and the middle shield-spacer 148 of FIG. 1, respectively.

The bottom shield-spacer 1604 is shown having bottom shield feet 1608 extending horizontally from bottom shield pillars 1610. The bottom shield-spacer 1604 can further include bottom shield through holes 1612. The bottom shield through holes 1612 are defined as convex extending structures.

The bottom shield through holes 1612 extend vertically through the bottom shield feet 1608. The bottom shield pillars 1610 extend from the bottom shield feet 1608 to bottom shield tie bars 1614. The bottom shield tie bars 1614 can extend to the bottom shield pillars 1610 or beyond the bottom shield pillars 1610.

The bottom shield-spacer 1604 further includes bottom shield male protuberances 1616 extending vertically up from the bottom shield tie bars 1614. The bottom shield male protuberances 1616 are defined as convex extending structures.

The top shield-spacer 1606 can be coupled to the bottom shield male protuberances 1616 of the bottom shield-spacer 1604. The top shield-spacer 1606 can include top shield through holes 1618 that fit into the bottom shield male protuberances 1616.

It has been discovered that utilizing the bottom shield-spacer 1604 including the bottom shield male protuberances 1616 coupled to the top shield through holes 1618 of the top shield-spacer 1606 provides greater surface area and mechanical coupling for securing the top shield-spacer 1606 to the bottom shield-spacer 1604.

The top shield-spacer 1606 can further include top shield feet 1620 above the top shield through holes 1618. The top shield through holes 1618 extend vertically through the top shield feet 1620. The top shield feet 1620 can be in direct contact with the bottom shield tie bars 1614.

The top shield-spacer 1606 can further have top shield pillars 1622 extending vertically away from the top shield feet 1620 to top shield tie bars 1624. The top shield tie bars 1624 can extend to or beyond the top shield pillars 1622. The top shield-spacer 1606 can further include top shield male protuberances 1626 extending vertically away from the top shield tie bars 1624. The top shield male protuberances 1626 are defined as convex extending structures.

Figure 17:
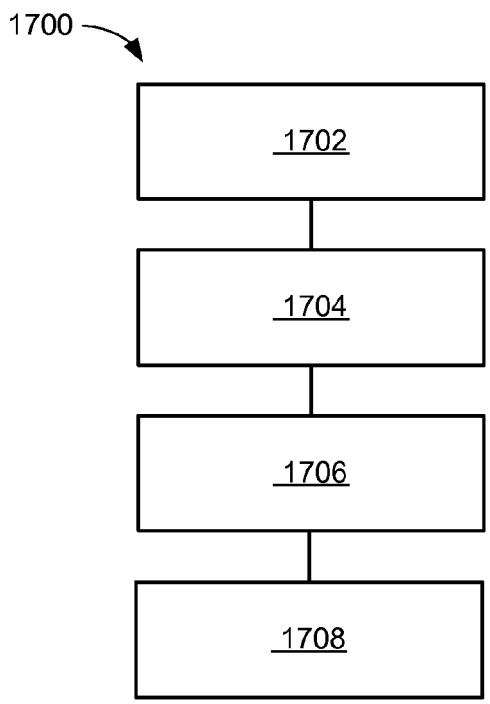
FIG. 17 is a flow chart of a method of manufacture of the integrated circuit packaging system in a further embodiment of the present invention.

Referring now to FIG. 17, therein is shown a flow chart of a method 1700 of manufacture of the integrated circuit packaging system in a further embodiment of the present invention. The method 1700 includes: providing a substrate in a block 1702; mounting a bottom integrated circuit over the substrate in a block 1704; connecting a bottom interconnect between the bottom integrated circuit and the substrate in a block 1706; and mounting a bottom shield-spacer above the bottom integrated circuit and the bottom shield-spacer includes a bottom shield plate above the bottom integrated circuit, a bottom shield pillar extending from a bottom shield foot and connected to the bottom shield plate, and a protuberance extending vertically above the bottom shield pillar and directly above the bottom shield foot in a block 1708.

Thus, it has been discovered that the integrated circuit packaging system and fan in interposer on lead of the present invention furnishes important and heretofore unknown and unavailable solutions, capabilities, and functional aspects for integrated circuit packaging system configurations. The resulting processes and configurations are straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a substrate;
a bottom integrated circuit over the substrate;
a bottom interconnect connected between the bottom integrated circuit and the substrate; and
a bottom shield-spacer above the bottom integrated circuit and the bottom shield-spacer includes a bottom shield plate above the bottom integrated circuit, a bottom shield pillar extends from a bottom shield foot and connects to the bottom shield plate, and a protuberance extends vertically above the bottom shield pillar and directly above the bottom shield foot.

2. The system as claimed in claim 1 wherein the bottom shield-spacer includes a bottom shield extension and the bottom shield extension extends above or below the bottom shield plate.

3. The system as claimed in claim 1 further comprising a top shield-spacer above the bottom shield-spacer in direct contact with the protuberance.

4. The system as claimed in claim 1 further comprising an adhesive deposited over the substrate for attaching and grounding the bottom shield-spacer.

5. The system as claimed in claim 1 wherein the bottom shield-spacer includes a bottom shield tie bar in direct contact with the bottom shield plate and the bottom shield tie bar overhangs the bottom shield pillar.

6. The system as claimed in claim 1 wherein the bottom shield plate of the bottom shield-spacer includes corner cover and the bottom shield pillar connects to the corner cover of the bottom shield plate.

7. The system as claimed in claim 6 wherein the bottom shield-spacer includes the bottom shield foot with a hole therethrough.

8. The system as claimed in claim 6 further comprising a middle integrated circuit above the bottom shield-spacer and the middle integrated circuit includes an overhang beyond the bottom integrated circuit.

9. The system as claimed in claim 6 wherein the protuberance is a bottom shield male protuberance, a bottom shield female protuberance, or a combination thereof.

10. The system as claimed in claim 6 further comprising a bottom adhesive below the bottom shield-spacer for affixing the bottom integrated circuit to the bottom shield-spacer.

* * * * *